US012765320B2

(12) United States Patent
Chu et al.

(10) Patent No.: US 12,765,320 B2
(45) Date of Patent: Oct. 13, 2026

(54) METHOD FOR FABRICATING (LED) DICE USING LASER LIFT-OFF FROM A SUBSTRATE TO A RECEIVING PLATE

(71) Applicants: SemiLEDs Corporation, Chu-Nan (TW); SHIN-ETSU CHEMICAL CO., LTD., Tokyo (JP)

(72) Inventors: Chen-Fu Chu, Hsinchu City (TW); Shih-Kai Chan, Miaoli County (TW); Yi-Feng Shih, Miaoli County (TW); David Trung Doan, Hsinchu County (TW); Trung Tri Doan, Hsinchu County (TW); Yoshinori Ogawa, Kanagawa (JP); Kohei Otake, Gunma (JP); Kazunori Kondo, Gunma (JP); Keiji Ohori, Saitama (JP); Taichi Kitagawa, Gunma (JP); Nobuaki Matsumoto, Gunma (JP); Toshiyuki Ozai, Gunma (JP); Shuhei Ueda, Niigata (JP); Junya Ishizaki, Annaka (JP)

(73) Assignees: SemiLEDs Corporation, Miao-Li County (TW); SHIN-ETSU CHEMICAL CO., LTD., Tokyo (JP)

( * ) Notice: Subject to any disclaimer, the term of this patent is extended or adjusted under 35 U.S.C. 154(b) by 1107 days.

(21) Appl. No.: 17/879,834

(22) Filed: Aug. 3, 2022

(65) Prior Publication Data

US 2023/0018855 A1 Jan. 19, 2023

Related U.S. Application Data

(63) Continuation-in-part of application No. 16/987,478, filed on Aug. 7, 2020, now Pat. No. 11,417,799.

(Continued)

(51) Int. Cl.
*H10H 20/01* (2025.01)
*H10H 20/832* (2025.01)
(Continued)

(52) U.S. Cl.
CPC .......... *H10P 72/74* (2026.01); *H10H 20/835* (2025.01); *H10H 20/857* (2025.01);
(Continued)

(58) Field of Classification Search
None
See application file for complete search history.

(56) References Cited

U.S. PATENT DOCUMENTS 6,071,795 A 6/2000 Cheung et al.
6,420,242 B1 7/2002 Cheung et al.
(Continued)

FOREIGN PATENT DOCUMENTS

EP 0 676 376 B1 11/1997
JP 2002366054 A 12/2002
(Continued)

OTHER PUBLICATIONS

M. K. Kelly et al., Optical patterning of GaN films, Applied Physics Letters 69, Sep. 16, 1996, p. 1749-1751.
(Continued)

*Primary Examiner* — Bradley Smith
(74) *Attorney, Agent, or Firm* — Stephen A. Gratton

(57) ABSTRACT

A method for fabricating light emitting diode (LED) dice includes the steps of: providing a substrate [30], and forming a plurality of die sized semiconductor structures [32] on the substrate [30]. The method also includes the steps of providing a receiving plate [42] having an elastomeric polymer layer [44], placing the substrate [30] and the receiving plate [42] in close proximity with a gap [101] therebetween, and performing a laser lift-off (LLO) process by directing a (Continued)

uniform laser beam through the substrate [30] to the semiconductor layer [50] at an interface with the substrate [30] to lift off the semiconductor structures [32] through the gap [101] onto the elastomeric polymer layer [44]. During the laser lift-off (LLO) process the elastomeric polymer layer [44] functions as a shock absorber to reduce momentum transfer, and as an adhesive surface to hold the semiconductor structures [32] in place on the receiving plate [42].

5 Claims, 35 Drawing Sheets

Related U.S. Application Data

(60) Provisional application No. 62/892,644, filed on Aug. 28, 2019.

(51) Int. Cl.
*H10H 20/857* (2025.01)
*H10P 72/70* (2026.01)

(52) U.S. Cl.
CPC ....... *H10H 20/032* (2025.01); *H10H 20/0364* (2025.01); *H10P 72/7428* (2026.01); *H10P 72/7432* (2026.01); *H10P 72/744* (2026.01)

(56) References Cited

U.S. PATENT DOCUMENTS 6,815,312 B2 11/2004 Furukawa et al.
6,818,532 B2 11/2004 Yeom et al.
6,959,854 B2 11/2005 Yokokawa et al.
7,473,571 B2 1/2009 Hwang et al.
7,670,929 B2 3/2010 Bourdelle et al.
7,736,945 B2 6/2010 Schiaffino et al.
7,842,547 B2 11/2010 Shelton et al.
8,294,172 B2 10/2012 Yoo et al.
8,552,436 B2 10/2013 Bibl et al.
8,794,501 B2 8/2014 Bibl et al.
8,921,204 B2 12/2014 Chu et al.
11,417,799 B2 8/2022 Chu et al.
11,862,754 B2 1/2024 Chu et al.
2004/0115849 A1* 6/2004 Iwafuchi ............. H01L 25/0753 257/E25.02
2005/0023550 A1 2/2005 Eliashevich et al.
2005/0227455 A1 10/2005 Park et al.
2013/0313562 A1* 11/2013 Epler ................... H10H 20/018 438/22
2015/0348874 A1 12/2015 Tsai
2015/0364639 A1 12/2015 Hong et al.
2016/0216138 A1* 7/2016 Rudmann ........ B29D 11/00307
2018/0333945 A1* 11/2018 Li .......................... H01L 24/81
2019/0165231 A1 5/2019 Doan et al.
2019/0392751 A1 12/2019 Hsieh
2020/0321234 A1* 10/2020 Choi ....................... H01L 25/50
2020/0373176 A1 11/2020 Priewasser
2021/0066541 A1 3/2021 Chu et al.
2021/0066547 A1 3/2021 Doan et al.
2021/0111326 A1* 4/2021 Shiau ................. H10H 20/8582
2021/0375833 A1* 12/2021 Lee ...................... H10H 20/857
2022/0315418 A1* 10/2022 Ogawa ...................... C08F 2/48
2022/0359785 A1 11/2022 Chu et al.
2022/0376135 A1* 11/2022 Pourchet ............... H10H 20/01
2023/0018855 A1 1/2023 Chu et al.

FOREIGN PATENT DOCUMENTS

JP 2003332633 A 11/2003
JP 2006128710 A 5/2006
JP 2010161221 A 7/2010
JP 2010177390 A 8/2010
JP 2017168548 A 9/2017
JP 2017533453 A 11/2017
JP 2018060993 A 4/2018
JP 2018531504 A 10/2018
JP 2019067892 A 4/2019
KR 10-2019-0057054 5/2019
WO WO 2010/015878 A2 2/2010
WO WO 2021/157191 A1 8/2021

OTHER PUBLICATIONS

W. S. Wong et al., Damage-free separation of GaN thin films from sapphire substrates, Applied Physics Letters 72, Feb. 2, 1998, p. 599-601.
W. S. Wong et al, Fabrication of thin-film InGaN light-emitting diode membranes by laser lift-off, Applied Physics Letters, Sep. 6, 1999, p. 1360-1362.
U.S. Appl. No. 10/118,316, filed Apr. 9, 2002, Jong L. Lee et al., entitled "Method of Fabrication Vertical Structure LEDS", pp. 1-25, abandoned.
Corresponding Japanese patent specification claiming priority to application No. 2020-016200 filed on Feb. 23, 2020 entitled "Addition Curable Silicone Pressure-Sensitive Adhesive Composition and Cured Product Thereof", pp. 1-26.
International application No. PCT/US 20/47137, International Search Report and Written Opinion of the International Searching Authority, date of mailing Nov. 19, 2020, pp. 1-10.
U.S. Appl. No. 16/987,478, filed Aug. 7, 2020, "Method for Fabricating (LED) Die Using Laser Lift-Off From a Substrate to a Receiving Plate", Chen-Fu Chu et al., Non-Final Rejection, mail date Dec. 16, 2021, pp. 1-7.
U.S. Appl. No. 16/987,478, filed Aug. 7, 2020, "Method for Fabricating (LED) Die Using Laser Lift-Off From a Substrate to a Receiving Plate", Chen-Fu Chu et al., Notice of Allowance, mail date Mar. 30, 2022, pp. 1-11.
U.S. Appl. No. 16/987,478, filed Aug. 7, 2020, "Method for Fabricating (LED) Die Using Laser Lift-Off From a Substrate to a Receiving Plate", Chen-Fu Chu et al., Notice of Allowance, mail date May 5, 2022, pp. 1-8.
U.S. Appl. No. 17/740,729, filed May 10, 2022, "Method for Fabricating (LED) Dice Using Semiconductor Structures On A Substrate and Laser Lift-Off to a Receiving Plate", Chen-Fu Chu et al., pp. 1-33.
U.S. Appl. No. 17/868,949, filed Jul. 20, 2022, "Method for Fabricating (LED) Dice Using Laser Lift-Off From A Substrate to a Receiving Plate", Chen-Fu Chu, pp. 1-30.

* cited by examiner

METHOD FOR FABRICATING (LED) DICE USING LASER LIFT-OFF FROM A SUBSTRATE TO A RECEIVING PLATE

CROSS REFERENCE TO RELATED APPLICATION

This application is a continuation-in-part of Ser. No. 16/987,478, U.S. Pat. No. 11,417,799, filed Aug. 7, 2020, which claims priority from U.S. Provisional No. 62/892,644, filed Aug. 28, 2019, which is incorporated herein by reference. This application is related to Ser. No. 17/740,729, U.S. Pat. No. 11,862,754, filed May 10, 2022.

FIELD

This disclosure relates to semiconductor fabrication and particularly to the fabrication of light emitting diode (LED) dice using semiconductor fabrication techniques.

BACKGROUND

In the fabrication of light emitting diode (LED) dice, GaN epitaxial stacks can be fabricated using a substrate, such as sapphire. For example, vertical light emitting diode (VLED) dice can be fabricated on a sapphire substrate along with a continuous secondary substrate formed using eutectic metal to bond a secondary substrate or by deposition of a secondary substrate on the epitaxial stacks using electroplating techniques.

FIGS. 1A-1C illustrate a prior art method of fabricating light emitting diode (LED) dice 10 (FIG. 1C) on a substrate 12. FIG. 1A illustrates the forming of semiconductor structures 14 comprised of a p-GaN layer 16, multiple quantum well (MQW) layers 18 and an n-GaN layer 20. FIG. 1B illustrates etching of openings 22 to define the (LED) dice 10. FIG. 1C illustrates forming of an insulating layer 26 in the openings 22, and forming of a continuous connecting secondary substrate 24 on the (LED) dice 10. FIG. 1C also illustrates the fabrication process following laser lift-off (LLO) of the substrate 12 and illustrates roughened surfaces 28 of the (LED) dice 10.

One problem that occurs during the laser lift-off (LLO) process involves the thermal decomposition of the n-GaN layer 20 (FIG. 1C) at the interface with the substrate 12 (e.g., GaN/sapphire interface). This thermal decomposition can produce explosive forces, forming cracks and micro-cracks in the (LED) dice 10. These cracks and micro-cracks can also spread out in unpredictable directions producing unusable (LED) dice 10. In addition, the damage caused by the momentum transfer during laser lift-off (LLO) causes device leakage and reliability issues. In the prior art, the continuous secondary substrate 24 (FIG. 1C) can be bonded, deposited, or grown on the semiconductor structures 14 before the laser lift-off (LLO) process to hold the (LED) dice 10 in place. However, after the secondary substrate 24 has been removed, due to the secondary substrate 24 holding the (LED) dice 10 together, the explosive force may have also caused damage to the epitaxial layers. The additional step of dicing is also needed to separate each single (LED) die 10 from adjacent dice before the single (LED) die 10 can be picked. The dicing process using a dicing saw or laser cutting is costly due to equipment cost and yield loss.

The present disclosure is directed to a method of laser lift-off (LLO) of semiconductor structures from a substrate without the need to bonding or forming a secondary substrate and without damage to the semiconductor structures.

The method also arranges the semiconductor structures on a receiving plate ready for picking up without the need to perform dicing.

SUMMARY

A method for fabricating light emitting diode (LED) dice includes the initial steps of providing a substrate and forming a plurality of die sized semiconductor structures on the substrate. The configuration of the semiconductor structures will depend on the type of (LED) dice being fabricated. For example, the method can be used for fabricating vertical light emitting dice (VLED) or flip chip light emitting dice (FCLED). As another example, the semiconductor structures can comprise flip chip light emitting diode (FCLED) dice having an epitaxial stack with an active layer having multiple layers in a stacked configuration including one or more layers configured as wavelength conversion members.

The method also includes the steps of providing a receiving plate having an elastomeric polymer layer with adhesive characteristics, and placing the substrate and the receiving plate in physical contact with an adhesive force applied by the elastomeric polymer layer. In illustrative embodiments, the elastomeric polymer layer comprises a cured pressure sensitive cured adhesive. In an alternate embodiment of the method the substrate and the receiving plate are not placed in physical contact but rather are placed in close physical proximity with a precise gap therebetween. The gap can be maintained using a gap holder or using a tool or tooling fixture that holds the substrate and the receiving plate apart by a precise distance.

The method also includes the step of performing a laser lift-off (LLO) process by directing a uniform laser beam through the substrate to the semiconductor layer at the interface with the substrate to lift off the semiconductor structures onto the elastomeric polymer layer. During the laser lift-off (LLO) process, the laser beam is focused on the semiconductor structures one at a time in sequence to remove either all of the semiconductor structures, or just selected semiconductor structure on the substrate. In addition, the laser beam has an outline greater than the footprint of a single semiconductor structure to form laser lift-off (LLO) areas that are greater than the areas of the semiconductor structures. In addition, during the lift-off (LLO) process, the elastomeric polymer layer on the receiving plate functions as a shock absorber to absorb kinetic energy from the semiconductor structures via momentum energy transfer. In the alternate embodiment of the method the laser lift-off (LLO) is performed to propel the semiconductor structures through the gap and onto the elastomeric polymer layer. Also in the alternate embodiment of the method, the semiconductor structures can include a sacrificial layer at the interface of the semiconductor structures with the substrate that is formed on the surface of a p-type confinement layer of the epitaxial stack. Also in the alternate embodiment of the method, the semiconductor structures can comprise dual pad light emitting diode (LED) dice configured to provide a spacing between the semiconductor structures and the elastomeric polymer layer.

The method can also include the step of selecting a laser wavelength and power such that during the laser lift-off (LLO) process, the laser beam can transmit through the substrate and be absorbed by the semiconductor layer at the interface with the substrate. In addition, by selecting the laser wavelength and power, the laser beam carries an energy density well below an absorption threshold of the substrate, allowing it to transmit through the substrate. In contrast, the laser energy density is high enough to cause photo-inducted decomposition of the semiconductor layer at the interface with the substrate, which allows debonding of the semiconductor layer at the interface. However, the receiving plate prevents any damage to the semiconductor structures by momentum transfer, and the elastomeric polymer material holds the die sized semiconductor structures in place on the receiving plate. The method can fabricate (LED) dice having a desired thickness that are as thin as the thickness of the epitaxial layers and the metal layers as there is no secondary substrate needed. The resulting thickness can be less than 50 μm and as thin as 10 μm. The method is particularly good for mini or micro LED dice having a width and length of less than 200 μm.

Following the laser lift-off (LLO) step, the method can also include the step of removing the die sized semiconductor structures from the receiving plate. This step can be performed using a conventional technique such as a pick and place mechanism for semiconductor dice, or a stamp having a higher adhesive force than the elastomeric polymer layer that is holding the semiconductor dice in place on the receiving plate. Since the die sized semiconductor structures are separated from the adjacent semiconductor structures before LLO and the secondary substrate is not needed, the step of separating each single semiconductor structure from adjacent structures using a die saw of laser dicing is eliminated, resulting in lower cost and higher yield.

BRIEF DESCRIPTION OF THE DRAWINGS

FIG. 4AA is an enlarged schematic cross sectional view illustrating the substrate and the receiving plate with a gap therebetween formed using a tool holder in an alternate embodiment of the method;

FIG. 4CC is an enlarged schematic cross sectional view illustrating the substrate and the receiving plate with a gap therebetween held using a gap holder and the semiconductor structure having a sacrificial layer in an alternate embodiment of the method;

DETAILED DESCRIPTION

Referring to FIGS. 2A-2E, a first step in a method for fabricating light emitting diode (LED) dice includes the steps of providing a substrate 30 (FIG. 2A) and forming a plurality of die sized semiconductor structures 32 (FIG. 2E) on the substrate 30. In an illustrative embodiment, the substrate 30 comprises a sapphire wafer and the semiconductor structures 32 have a die size and include different layers of compound semiconductor materials formed on the substrate 30.

The die sized semiconductor structures 32 can be formed using conventional semiconductor fabrication techniques and physically separated by etching a pattern of criss cross openings 38 (FIG. 2B) to the surface of the substrate 30. However, the exact construction of the semiconductor structures 32 will depend on the type of (LED) dice being fabricated.

Figure 2A:
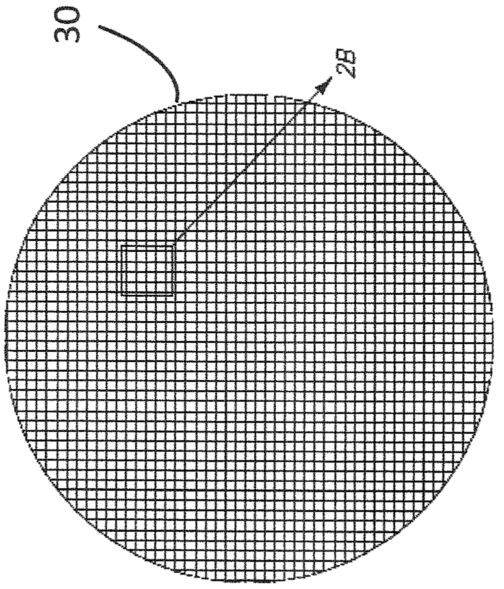
FIG. 2A is a schematic plan view of a substrate and semiconductor structures formed on the substrate.
Figure 2C:
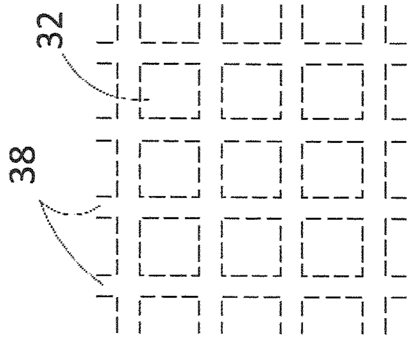
FIG. 2C is a bottom view equivalent to FIG. 2B but taken from the opposing side of the substrate.
Figure 2B:
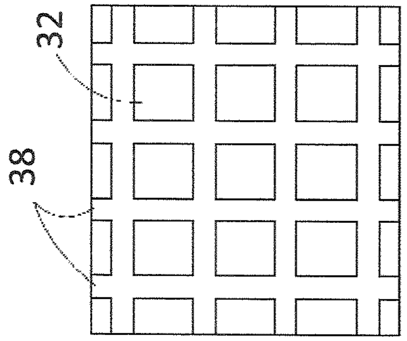
FIG. 2B is an enlarged portion of the substrate taken along section line 2B of FIG. 2A.
Figure 2D:
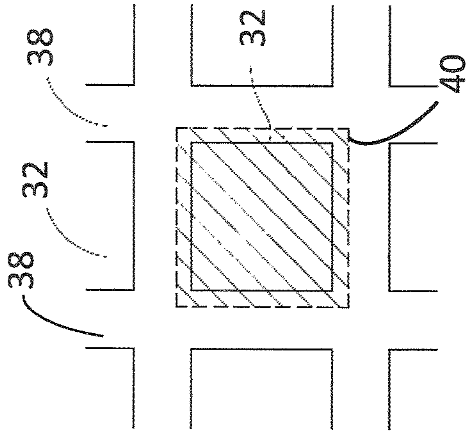
FIG. 2D is a schematic plan view illustrating a laser beam focused on one of the semiconductor structures during a laser lift-off (LLO) step of the method.
Figure 2E:
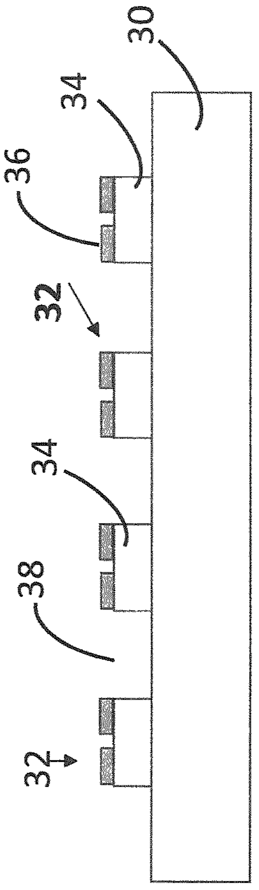
FIG. 2E is an enlarged schematic cross sectional view illustrating the semiconductor structures on the substrate.
Figure 9A:
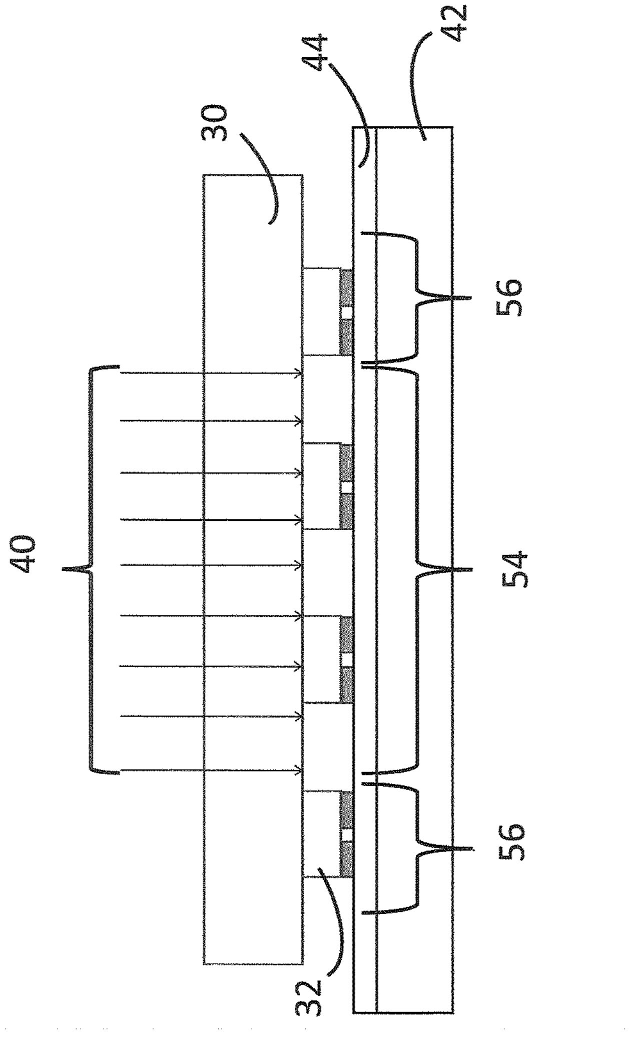
FIG. 9A is a schematic cross sectional view illustrating characteristics of the laser lift-off (LLO) step of the method wherein the semiconductor structures can be selectively lifted off of the receiving plate.
Figure 9B:
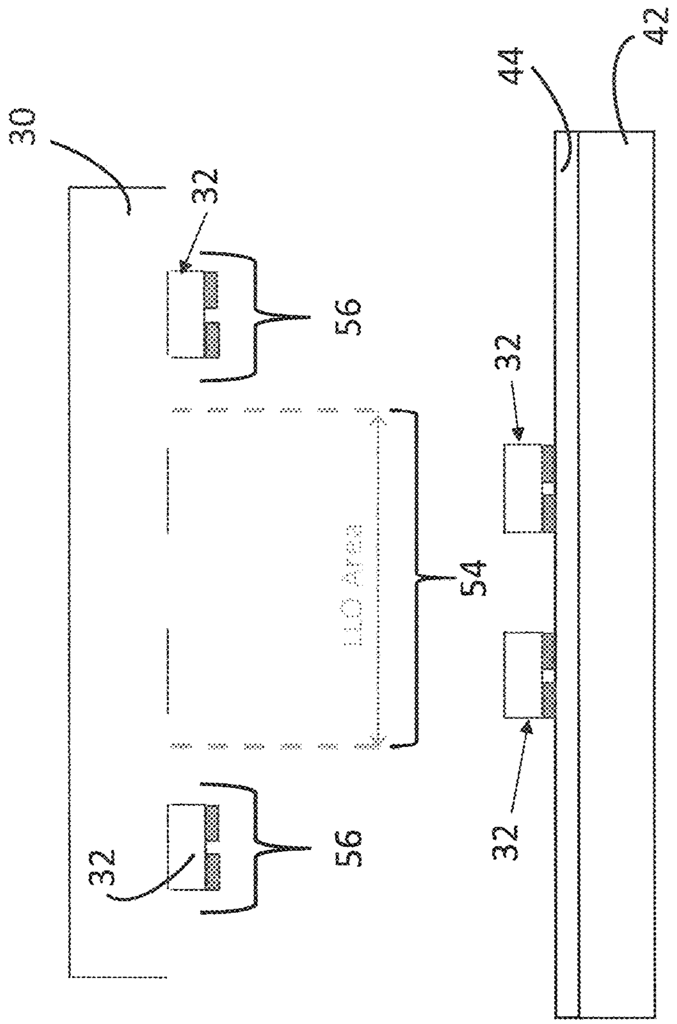
FIG. 9B is a schematic cross sectional view after the laser lift-off (LLO) step of the method wherein the substrate includes non-laser lift-off (LLO) areas where the die sized semiconductor structures are attached to the substrate and laser lift off (LLO) areas where the die sized semiconductor structures have been lifted onto an elastomeric layer of the receiving plate.

The GaN layer 34 (FIG. 2E) can be hetero-epitaxially grown on the substrate 30 (FIG. 2E) using techniques that are known in the art. Please note that following the etching process, there is no GaN material in the openings 38. To facilitate GaN crystal growth, an initial GaN layer can be deposited at a relatively low temperature, less than 800° C., causing the initial GaN layer to contain a high density of various defects due to a large lattice mismatch. Crystal defects, such as dislocations, nanopipes and inversion domains, elevate surface energy which results in higher absorption of the laser beam. During a subsequent laser-lift off (LLO) step, GaN will quickly decompose to gallium metal vapor and nitrogen gas resulting in explosive force acting on the semiconductor structures 32 and the substrate 30. The die sized semiconductor structures 32 are much smaller in weight as well as size, compared to the substrate 30, such that each semiconductor structure 32 will have a large force acting on it. In the illustrative embodiment, the semiconductor structures 32 are measured in microns and the substrate 30 is measured in millimeters. As also shown in FIG. 2E, a laser beam 40 used for the subsequent laser lift-off (LLO) step has an outline that is larger than the footprint of the die sized semiconductor structures 32 that one desires to lift off (LLO). In addition, one can lift off more than one die sized semiconductor structure at a time by changing the size of the laser beam 40 as shown in FIGS. 9A-9B.

Figure 3:
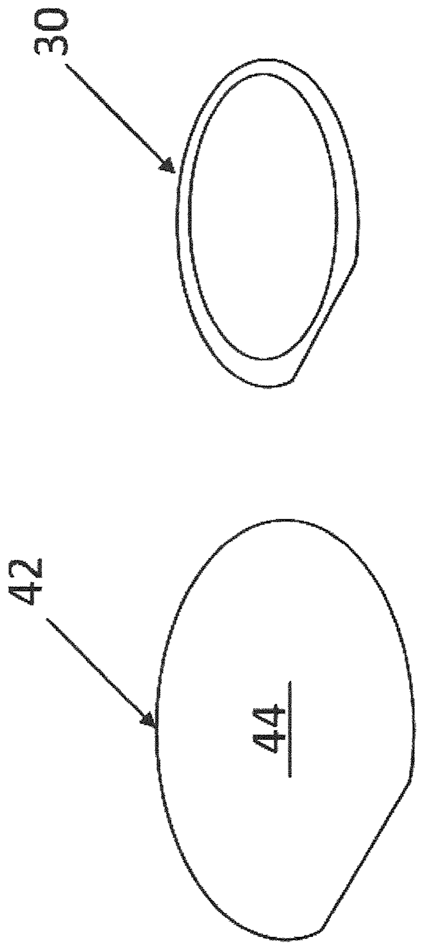
FIG. 3 is a schematic perspective view illustrating a receiving plate and the substrate prior to being placed in physical contact.

Referring to FIG. 3, the method for fabricating light emitting diode (LED) dice also includes the step of providing a receiving plate 42 coated with an elastomeric polymer layer 44. A preferred material for the receiving plate comprises quartz. Exemplary materials for the elastomeric polymer layer 44 include silicone, siloxane, rubber, or other elastomeric based material. As shown in FIG. 3, the receiving plate 42 can have a size and shape that corresponds to, but is slightly larger than, the size and shape of the substrate 30. For example, if the substrate 30 comprises a circular wafer, the receiving plate 42 can comprise a circular plate that is slightly larger than the circular wafer.

Figure 4:
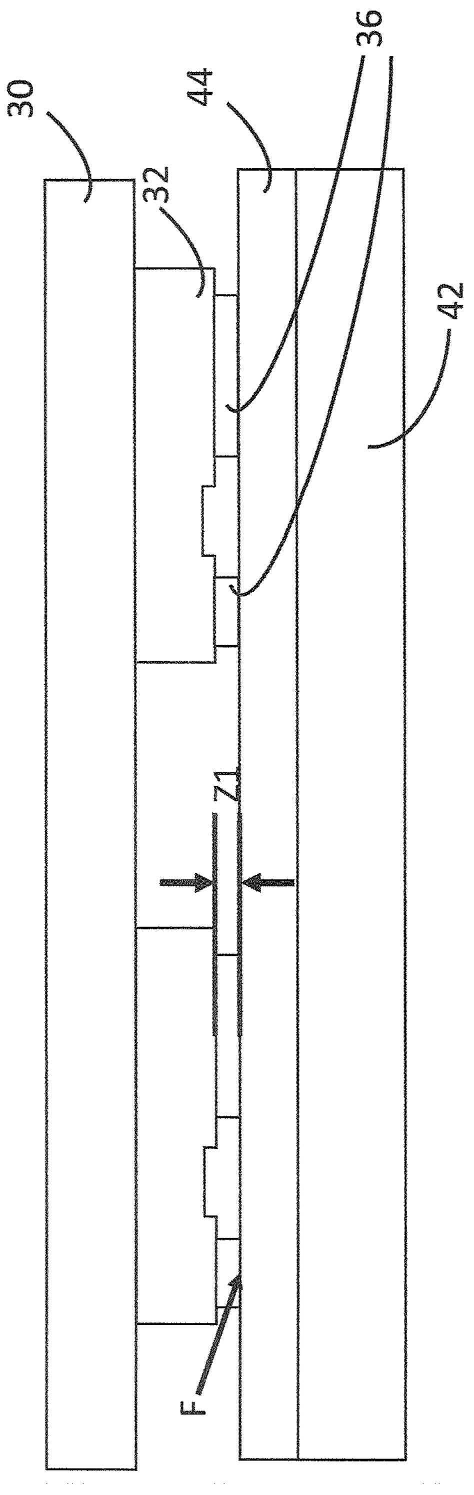
FIG. 4 is an enlarged schematic cross sectional view illustrating the substrate and the receiving plate in physical contact with an adhesive force applied by the elastomeric polymer layer during the method.

Referring to FIG. 4, the method for fabricating light emitting diode (LED) dice also includes the step of placing the substrate 30 and the receiving plate 42 in physical contact with an adhesive force applied by the elastomeric polymer layer 44. As shown in FIG. 4, the semiconductor structures 32 can have the configuration of vertical light emitting diode (VLED) dice, such that the pad electrodes 36 provide a spacing of Z1 between the semiconductor structures 32 and the elastomeric polymer layer 44. In addition, an adhesive force F is applied to the pad electrodes 36 by the elastomeric polymer layer 44. The die sized semiconductor structure 32 is still physically connected to the substrate 30 but physically separated from the adjacent semiconductor structures.

Figure 4A:
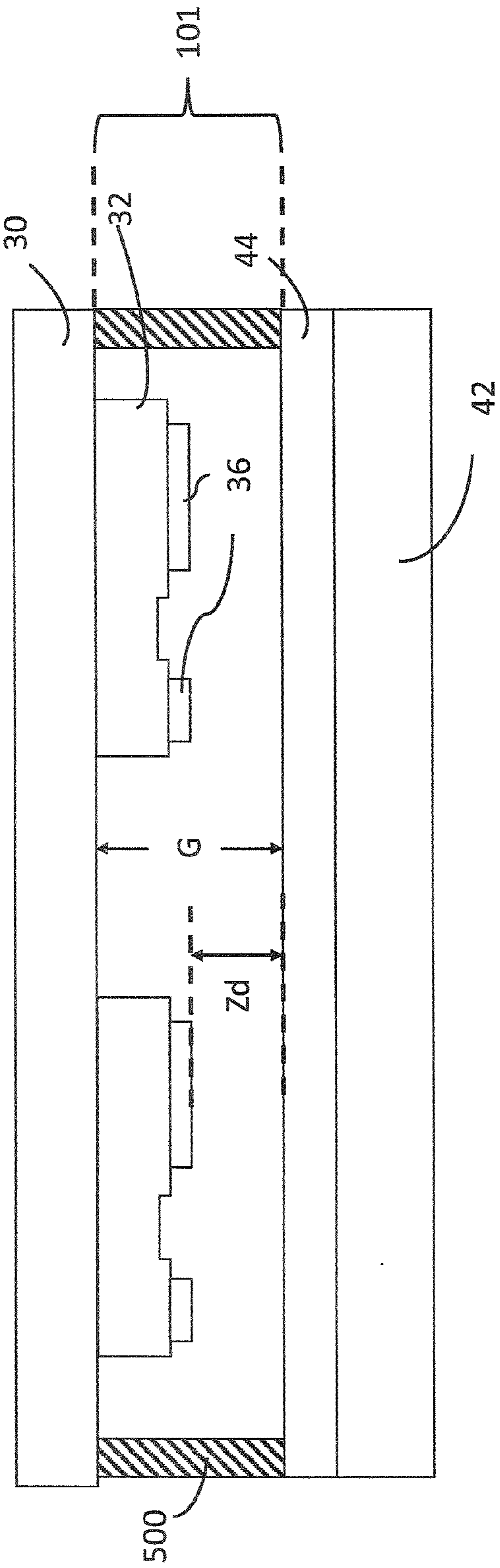
FIG. 4A is an enlarged schematic cross sectional view illustrating the substrate and the receiving plate with a gap therebetween formed using a gap holder in an alternate embodiment of the method.
Figure 4A:
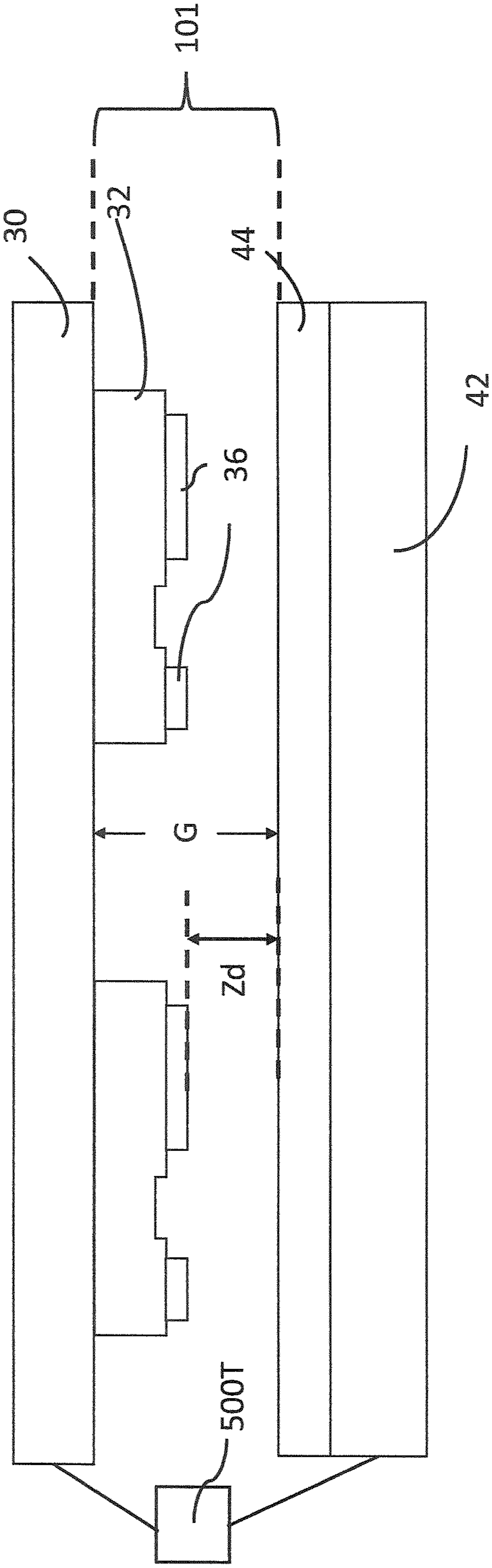

Referring to FIG. 4A, an alternate embodiment method for fabricating light emitting diode (LED) dice can also include the step of placing the substrate 30 and the receiving plate 42 in close physical proximity to one another with a gap 101 therebetween. A representative thickness of the gap G can be from 10 um to 3 or more mm measured from the opposing surfaces of the substrate 30 and the receiving plate 42. In addition, as shown in FIG. 4A, the semiconductor structures 32 can have the configuration of dual pad light emitting diode (LED) dice, such that the pad electrodes 36 provide a spacing Zd between the semiconductor structures 32 and the substrate 30. A representative thickness of the spacing Zd can be from 1 um to 3 or more mm measured from the pad electrodes 36 to the surface of the elastomeric polymer layer 44 on the receiving plate 42. The purpose of the spacing Zd is to reduce or alleviate entirely the effect of an laser lift-off (LLO) shock wave generated during the laser lift-off process. Further, the gap 101 between the elastomeric polymer layer 44 and the substrate 30 can be maintained using a gap holder 500. The gap holder 500 can be made of a deposited material, such as a polymer or can comprise a separate item configured to space the substrate 30 from the receiving plate 42 to provide the gap 101 and maintain a precise distance between the substrate 30 and the receiving plate 42. Still further, the gap holder 500 can also be replaced by a tool or a tooling fixture 500T from the machine that holds the substrate 30 (not shown in here) to provide the gap G between the substrate 30 and the receiving plate 42 as shown in FIG. 4AA.

Figure 4B:
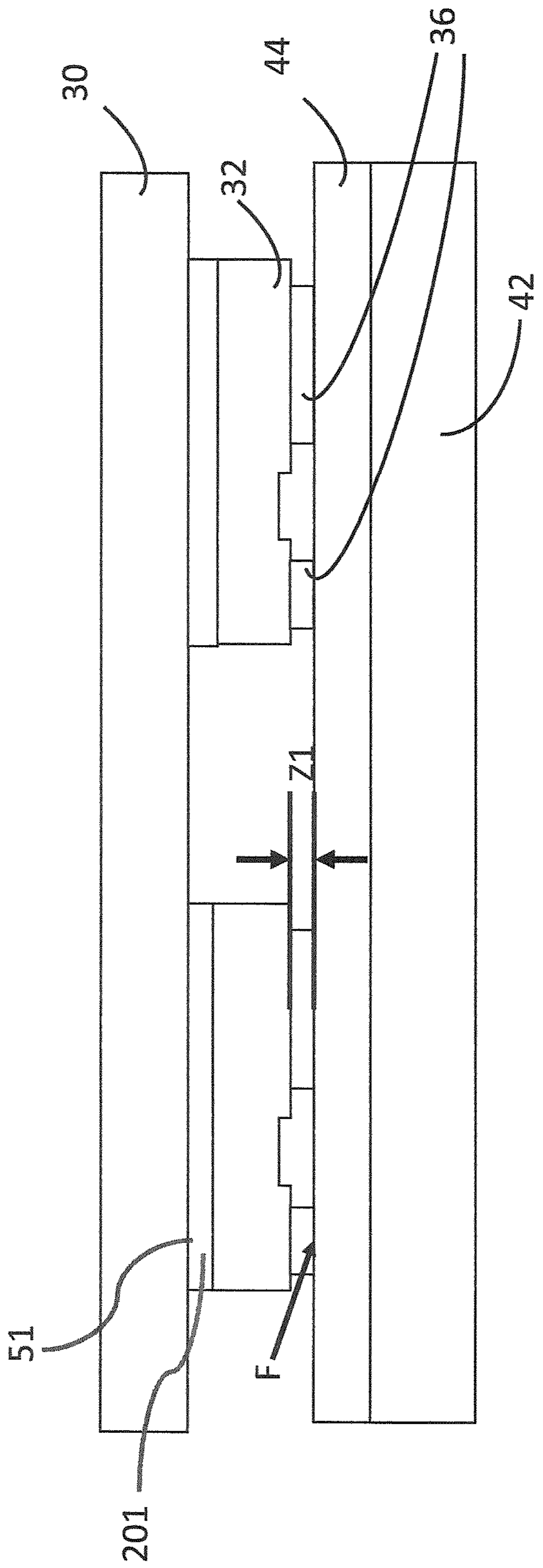
FIG. 4B is an enlarged schematic cross sectional view illustrating the substrate and the receiving plate placed together with the sacrificial layer applying an adhesive force to the substrate in an alternate embodiment of the method.

FIG. 4B illustrates another embodiment for fabricating light emitting diode (LED) dice which includes the step of placing the substrate 30 and the receiving plate 42 in physical contact again with an adhesive force applied by the elastomeric polymer layer 44. However, as shown in FIG. 4B, the semiconductor structures 32 can be provided on the substrate 30 to include a sacrificial layer 201. The sacrificial layer 201 generates an adhesive force to physically connect the semiconductor structures 32 and the substrate 30. In this embodiment, the semiconductor structures 32 can have the configuration of dual pad light emitting diode LED dice, such that the pad electrodes 36 provide a spacing of Z1 between the semiconductor structures 32 and the elastomeric polymer layer 44. In addition, an adhesive force F is applied to the pad electrodes 36 by the elastomeric polymer layer 44. The die sized semiconductor structures 32 are still physically connected to the substrate 30 but are physically separated from the adjacent semiconductor structures.

Figure 4C:
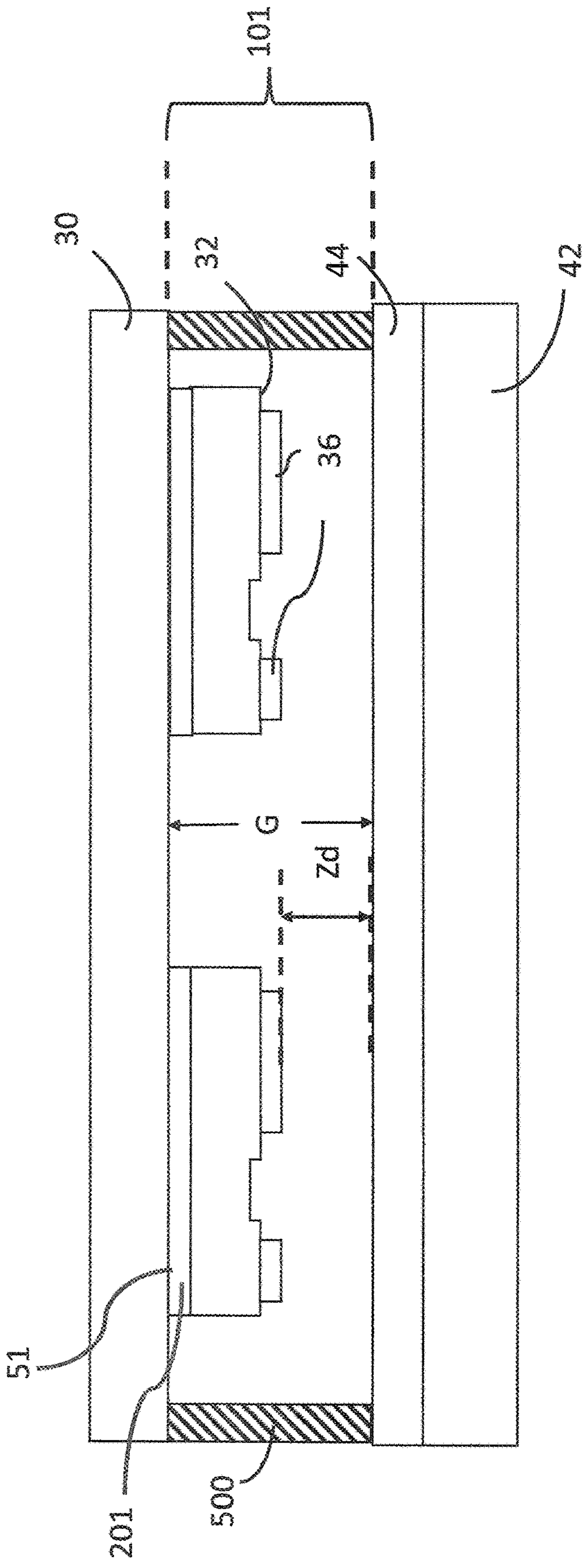
FIG. 4C is an enlarged schematic cross sectional view illustrating the substrate and the receiving plate with a gap therebetween held using a gap holder and the semiconductor structure having a sacrificial layer in an alternate embodiment of the method.
Figure 4C:
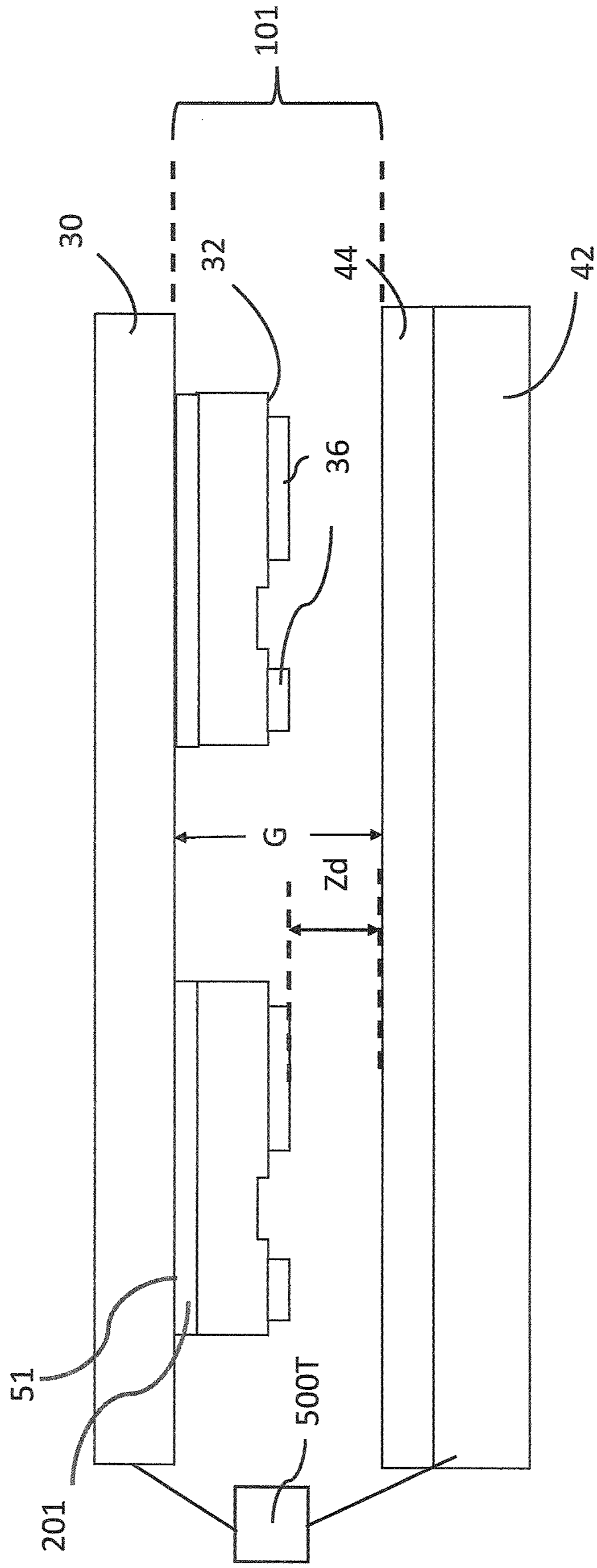

FIG. 4C illustrates another embodiment for fabricating light emitting diode (LED) dice that includes the step of placing the substrate 30 and the receiving plate 42 in close, aligned physical proximity to one another with a gap 101 therebetween. As shown in FIG. 4C, the semiconductor structures 32 can be provided on the substrate 30 with a sacrificial layer 201. In this embodiment, the semiconductor structures 32 can have the configuration of dual pad light emitting diode (LED) dice, such that the pad electrodes 36 provide a spacing Zd between the semiconductor structures 32 and the elastomeric polymer layer 44. In addition, a gap holder 500 maintains the spacing Zd. Please note that the gap holder 500 can alternately be replaced by a tool or a tooling fixture 500T (FIG. 4CC) from the machine that holds the substrate 30 (not shown here) to provide a precise gap between the substrate 30 and the receiving plate 42 as well as the spacing Zd. In some embodiment the spacing Zd provides the gap G, such that the gap holder 500 can be eliminated.

Figure 5:
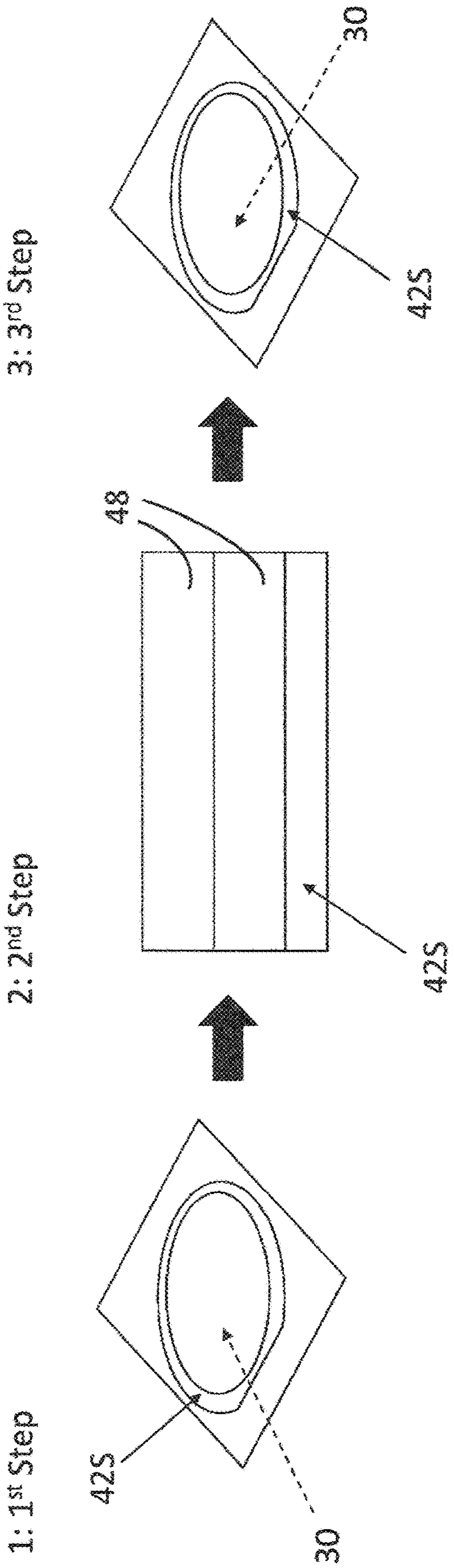
FIG. 5 is a schematic flow diagram illustrating an exemplary sequence for placing the substrate and the receiving plate in physical contact.
Figure 6:
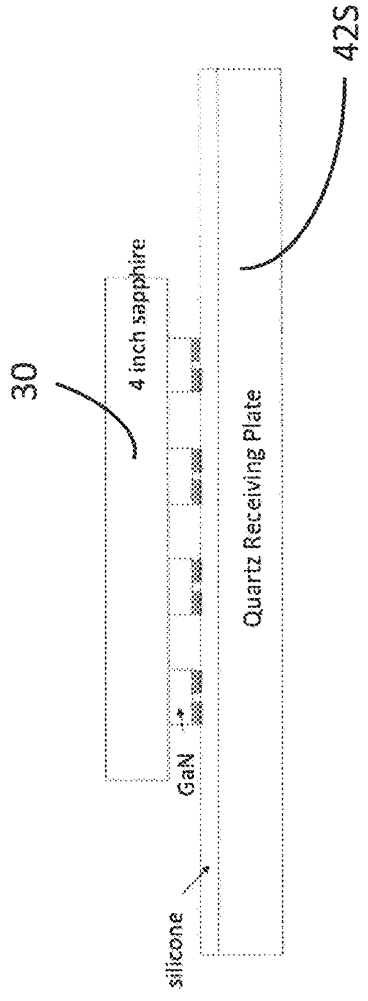
FIG. 6 is a schematic cross sectional view illustrating the substrate and the receiving plate in physical contact.

Example 1. Referring to FIGS. 5 and 6, an exemplary placing step uses a four inch diameter circular substrate 30 and a six inch square receiving plate 42S. In this example, the elastomeric polymer layer 44 comprises a cured silicone pressure sensitive adhesive configured to apply the adhesive force. Other suitable materials for the elastomeric polymer layer 44 include sorbothane and neoprene. One suitable adhesive is disclosed in Japanese Patent Application No. 2020-016200 filed on Feb. 3, 2020, entitled “Addition Curable Silicone Pressure-Sensitive Adhesive Composition and Cured Product Thereof”, which is incorporated by reference.

As shown in FIG. 5, the placing step can include a first step of placing the substrate 30 and the receiving plate 42S in physical contact, a second step of applying a weight 48 and curing the elastomeric polymer layer 44 using the weight 48, and a third step of removing the weight 48. By way of example, the elastomeric polymer layer 44 can have an adhesive force of more than 0.08 MPa, <70 type A hardness, and a tensile strength of >0.01 MPa.

Table 1 identifies some characteristics of a spin on elastomeric polymer layer 44 made of silicone.

TABLE 1

| Materials | Silicone Sample |
|---|---|
| Viscosity (Pa-s) | 3.0-7 |
| Spin coating condition (Target thickness = 20 μm) | 2500 RPM × 60-180 sec |
| Standard curing condition | 150° C.; 30 min-2 hr |
| Hardness (Type A) | 5-70 |
| Tensile strength (MPa) | 0.5-5 |
| Elongation at break (%) | 90-250 |
| Specific gravity (g/cm$^3$) | 1.03-1.1 |
| Sticky force at 200 mm/min (MPa) | 0.05-0.5 |

Figure 7:
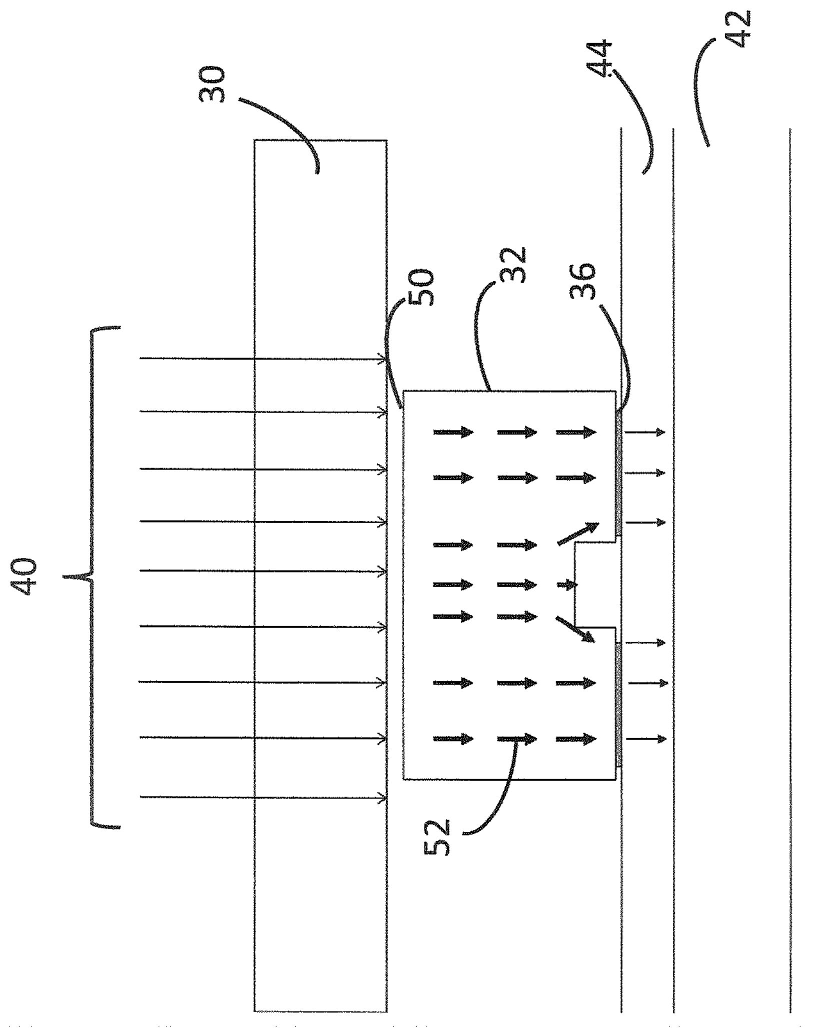
FIG. 7 is a schematic cross sectional view illustrating a laser lift-off (LLO) step of the method.
Figure 8:
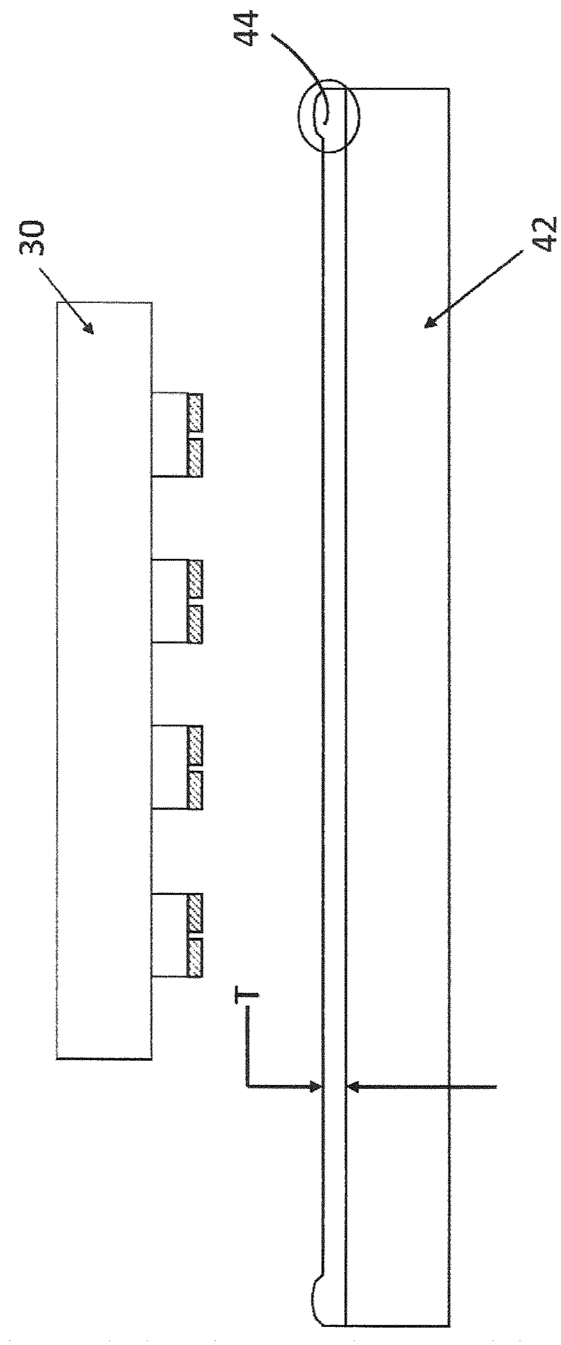
FIG. 8 is a schematic cross sectional view illustrating exemplary characteristics of the receiving plate for laser lift-off (LLO) with a spin on elastomeric polymer layer.

Referring to FIGS. 7 and 8, the method for fabricating light emitting diode (LED) dice also includes the step of performing a laser lift-off (LLO) process. During the laser lift-off process, a uniform laser beam 40 is directed through the substrate 30 onto an interfacial semiconductor layer 51 at the interface with the substrate 30 to lift off the die sized semiconductor structures 32 onto the receiving plate 42. During the laser lift-off (LLO) process each semiconductor structure 32 is individually pushed towards the receiving plate 42 by decomposition of the interfacial semiconductor layer 51. For example, with the interfacial semiconductor layer 51 comprised of GaN, decomposition will be to gallium (G) and nitrogen (N2) in gaseous form. In FIG. 7, this explosive force is represented by explosive force arrows 52 that pass through the semiconductor structure 32 and are absorbed by the elastomeric polymer layer 44 on the receiving plate 42. The elastomeric polymer layer 44 acts as a soft cushion or shock absorber to absorb the kinetic energy from the semiconductor structure 32 via momentum energy transfer. The semiconductor structure 32 comes to rest on the elastomeric polymer layer 44 undamaged and stays in the desired position on the receiving plate 42. Each semiconductor structure 32 is now separated from the substrate 30 without the need to bonding or forming a secondary substrate and without damage to the semiconductor structures 32.

Figure 8A:
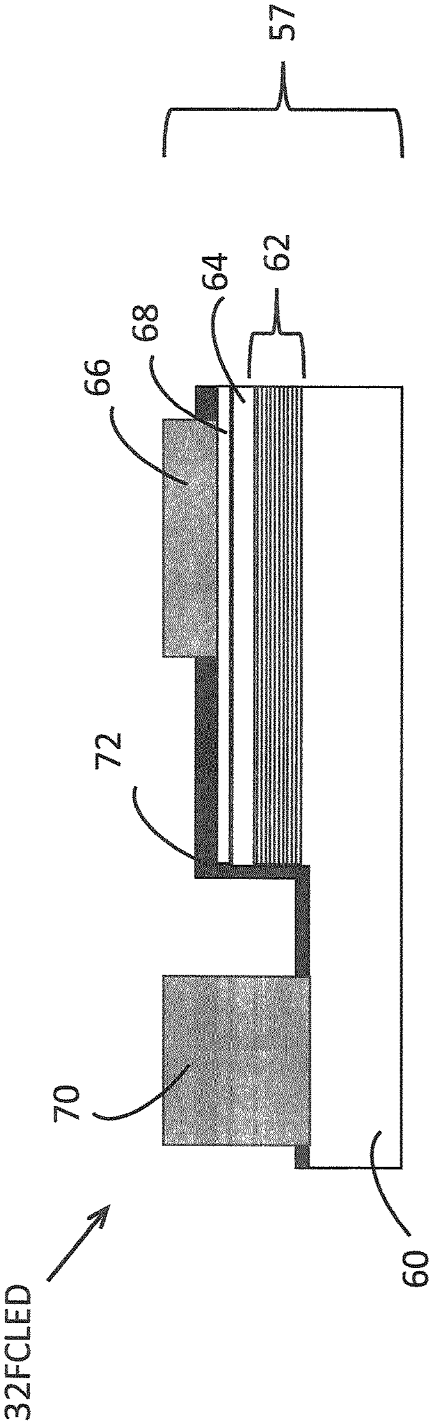
FIG. 8A is a schematic cross sectional view illustrating a semiconductor structure having the configuration of a flip chip light emitting diode (FCLED) provided in an alternate embodiment of the method.
Figure 8B:
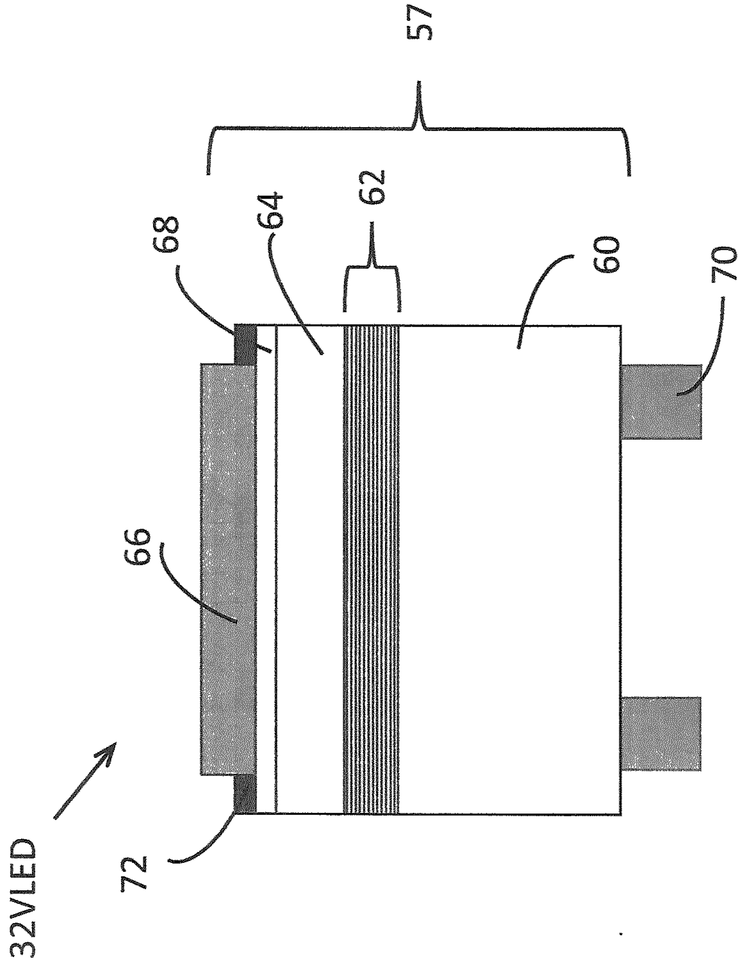
FIG. 8B is a schematic side elevational view illustrating the flip chip light emitting diode (FCLED) of FIG. 8A provided in the alternate embodiment of the method.

As shown in FIGS. 8A and 8B, in some embodiments the semiconductor structures 32 can comprise flip chip light emitting diode (FCLED) dice 32FCLED. Each flip chip light emitting diode (LED) die 32FCLED includes an epitaxial stack 57 comprised of a p-type confinement layer (P-layer) 64, an n-type confinement layer (n-layer) 60, an active layer (multiple quantum well (MQW) layer) 62 between the confinement layers configured to emit light, P-metal layers 66 making contact to the p-type confinement layer (P-layer) 64, a mirror layer 68, an isolation layer 72, and an n-electrode 70 making contact to the n-type confinement layer (N-layer) 60. The n-electrode 70 can be made using conventional metallization techniques.

Figure 7A:
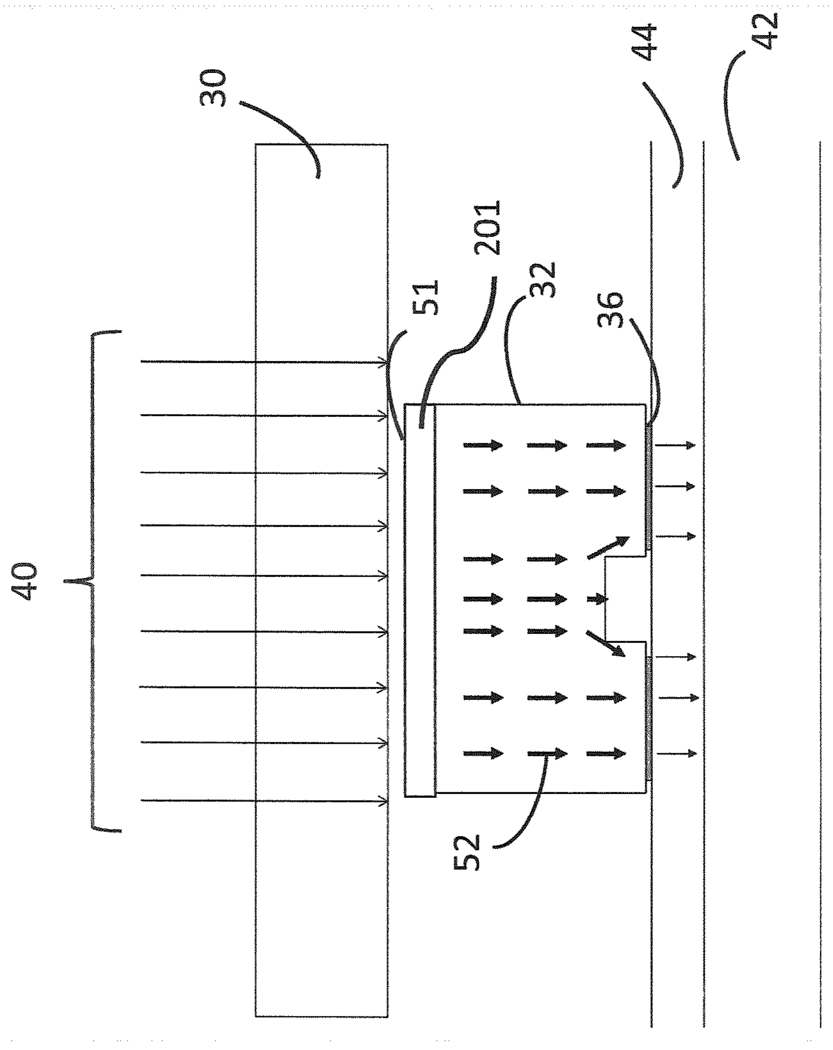
FIG. 7A is a schematic cross sectional view illustrating a laser lift-off (LLO) step in an alternate embodiment of the method using a sacrificial layer applying an adhesive force to the substrate.

Referring to FIG. 7A, the alternate embodiment method for fabricating light emitting diode (LED) dice can also include the step of performing a laser lift-off (LLO) process. During the laser lift-off process, a uniform laser beam 40 is directed through the substrate 30 onto an interfacial layer 51 of the sacrificial layer 201 at the interface with the substrate 30 to lift off the die sized semiconductor structures 32 onto the receiving plate 42. During the laser lift-off (LLO) process each semiconductor structure 32 is individually pushed towards the receiving plate 42 by decomposition of the interfacial layer 51 of the sacrificial layer 201. For example, the laser can interact with the interfacial layer 51 of the sacrificial layer 201 when it is comprised of a polymer. In this case decomposition can be to carbon, hydrogen or oxygen containing material to break the majority of the bonds between the interfacial layer 201 and the substrate 30 resulting in the separation of the die 32 from the substrate 30 due to loss of adhesion. This decomposition of the polymer has an ablation effect in a very short time (<micro sec) creating a force acting on the sacrificial layer 201. Thus, a momentum can be transmitted to the LED dice. In FIG. 7A, the force is represented by laser ablation force arrows 52 that pass through the semiconductor structure 32 and are absorbed by the elastomeric polymer layer 44 on the receiving plate 42. The elastomeric polymer layer 44 acts as a soft cushion or shock absorber to absorb the kinetic energy from the semiconductor structure 32 via momentum energy transfer. The semiconductor structure 32 comes to rest on the elastomeric polymer layer 44 undamaged and remain in the desired position on the receiving plate 42. The semiconductor structure 32 is now separated from the substrate 30 without the need for bonding or forming a secondary substrate and without damage to the semiconductor structures 32.

Figure 10:
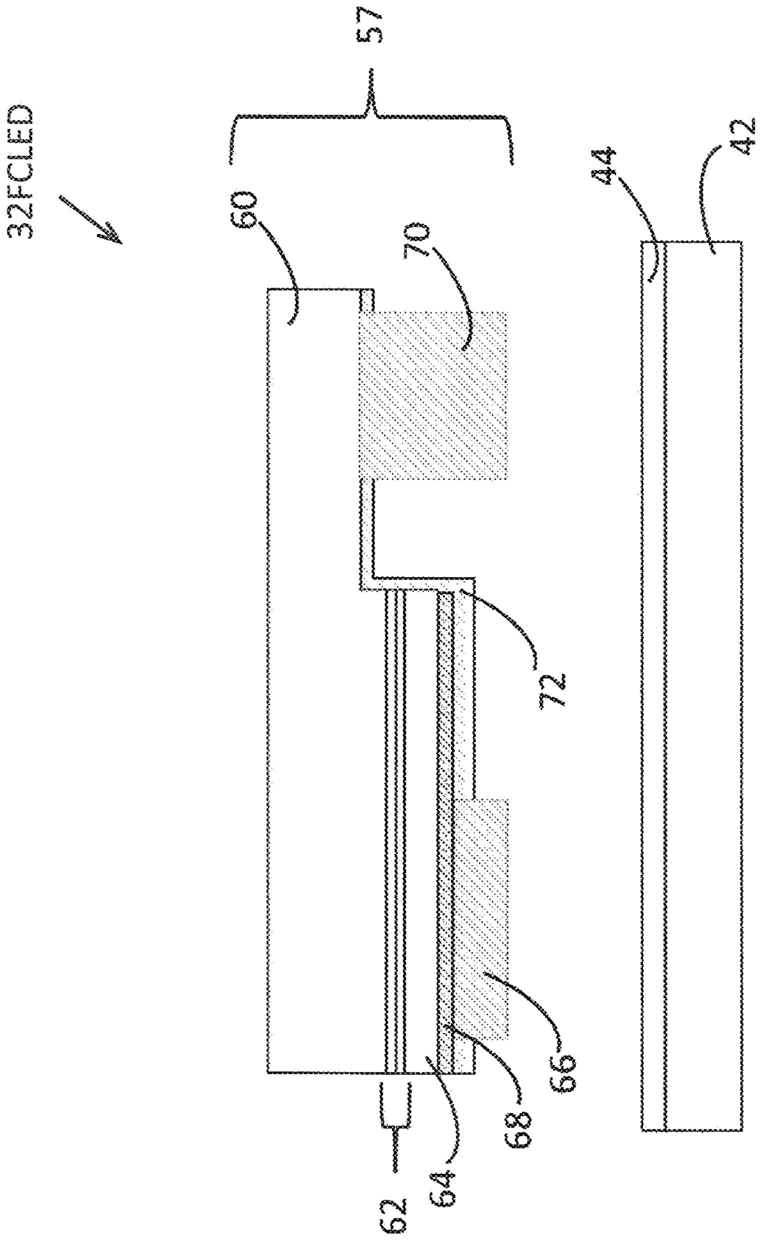
FIG. 10 is a schematic cross sectional view of a completed semiconductor structure in the form of a flip chip light emitting diode (FCLED) die.

Referring to FIG. 10, a completed semiconductor structure that has been separated from the receiving plate 42 can comprise a flip chip light emitting diode (FCLED) die 32FCLED. The flip chip light emitting diode (LED) die 32FCLED includes an epitaxial stack 57 comprised of a p-type confinement layer (P-layer) 64, an n-type confinement layer (N-layer) 60, an active layer (multiple quantum well (MQW) layer) 62 between the confinement layers configured to emit light, P-metal layers 66 making contact to the p-type confinement layer (P-layer) 64, a mirror layer 68, an isolation layer 72, and an N-electrode 70 making contact to the n-type confinement layer (N-layer) 60. A representative thickness of the P-metal layers can be from hundreds of nm to 3 or more um. A representative thickness of the N-electrode 70 can be from hundreds of nm to ten or more um.

Figure 10A:
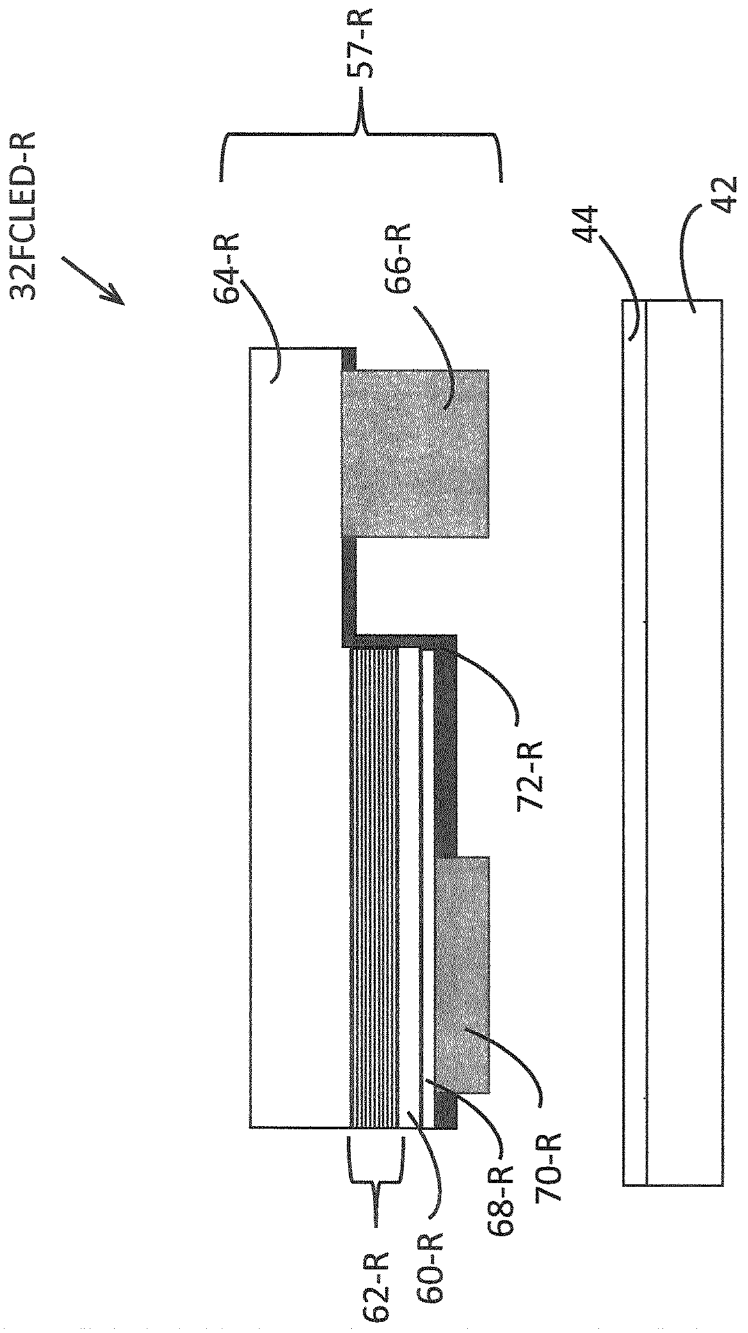
FIG. 10A is a schematic cross sectional view of a completed semiconductor structure in the form of a flip chip light emitting diode (FCLED) die having a different configuration epitaxial stack.

FIG. 10A illustrates a red flip chip light emitting diode (FCLED) die 32FCLED-R. The flip chip light emitting diode (LED) die 32FCLED-R includes an epitaxial stack 57-R comprised of a p-type confinement layer (P-layer) 64-R having a surface (i.e., backside of the red flip chip light emitting diode (FCLED) die 32FCLED-R), an n-type confinement layer (N-layer) 60-R having an opposing surface, an active layer (multiple quantum well (MQW) layer) 62-R between the confinement layers configured to emit light, P-metal layer 66-R making contact to the p-type confinement layer (P-layer) 64-R, a mirror layer 68-R, an isolation layer 72-R, and an N-electrode 70-R making contact to the n-type confinement layer (N-layer) 60-R. A representative thickness of the epitaxial stack 57-R is Te and a representative thickness Tm of the etched epitaxial thickness (from n-type layer to the exposed p-type layer). For the die robust and integrity for the laser lift-off LLO process, the ratio of the thickness Tm/Te is specific to be less than 0.4. As also shown in FIG. 10A, a portion of the P-metal layer 66-R forms a P-electrode that is located on an etched portion of the epitaxial stack 57-R that exposes a portion of the p-type confinement layer (P-layer). The surfaces of P-metal layer 66-R and the N-electrode 70-R are substantially coplanar to facilitate flip chip bonding of the red flip chip light emitting diode (FCLED) die 32FCLED-R. Other exemplary characteristics of the red flip chip light emitting diode (FCLED) die 32FCLED-R include:

a. the red flip chip light emitting diode (FCLED) die 32FCLED-R has a device thickness of <20 um and a die size smaller than 100 um,
b. The electrodes (i.e., the P-metal layer 66-R that forms the P-electrode and the N-electrode 70-R) have substantially similar heights,
c. The height difference between the electrodes (i.e., the P-metal layer 66-R that forms the P-electrode and the N-electrode 70-R) is <5 um,
d. The P-metal layer 66-R that forms the P-electrode has a thickness that is greater than the thickness of the N-electrode 70-R,
e. P-type confinement layer (P-layer) 64-R has thickness of >4 um.

Example 2. An exemplary laser lift-off (LLO) process uses a 248 nm laser beam 40, such as a KrF excimer laser with wavelength of λ=248 nm and pulse width of 25 ns. The laser output energy can be varied from 10 nJ to 50 mJ. The laser beam is reshaped and homogenized using a special optical system to form an uniform beam profile, preferably less than 10% RMS. The LLO processing beam passed through a projection system and then focuses onto the wafer/sample with a spot size such as 0.9×0.9 $mm^2$. Other laser beam sizes and shapes can be used. The excimer laser is not limited to KrF (248 nm). For example, the excimer laser can be from a F2 excimer laser (155 nm), to an ArF excimer laser (198 nm). An excimer laser typically uses a combination of a noble gas (argon, krypton, or xenon) and a reactive gas (fluorine or chlorine). The receiving plate 42 is preferably larger than the substrate 30. In addition, the receiving plate 42 is preferably flat with a TTV (total thickness variation) of less than <5 μm, but more preferably less than <2 um, for preventing flipping, titling, rotating and cracking of the semiconductor structures 32 after the laser lift-off (LLO) process. In addition, the receiving plate 42 can include one or more alignment marks for aligning the semiconductor structures 32 on the substrate 30. Proper alignment also ensures proper placement of the semiconductor structure 32 on the receiving plate 42 following the laser lift-off (LLO) process (i.e., desired coordinate on the receiving plate 42). In addition, the receiving plate 42 can include one or more notches or flats for pre-alignment.

Example 3. Referring to FIGS. 9A and 9B, in this example the receiving plate 42 includes a spin-on elastomeric polymer layer 44 comprised of a cured silicon pressure-sensitive adhesive composition. Also in this example, the substrate 30 comprises a four inch diameter wafer and the receiving plate 42 comprises a six inch diameter circular plate. Further, the receiving plate 42 has a TTV (total thickness variation) of 5 μm. For forming the elastomeric polymer layer 44 the elastomer can be dispensed on the center of the receiving plate 42 using a spin coater to provide a selected thickness T (e.g., −20 μm). For a spin-on process, the thickness T of the elastomeric polymer layer 44 will be the function of spin speed, the spin-on liquid viscosity and other factors. Normally the thickness T is radially dependent. To provide optimum thickness uniformity, one would use a larger diameter receiving plate 42. Rather than spin coating, the elastomeric polymer layer 44 can also be applied by vapor deposition, doctor blade, or screen printing.

Figure 1A:
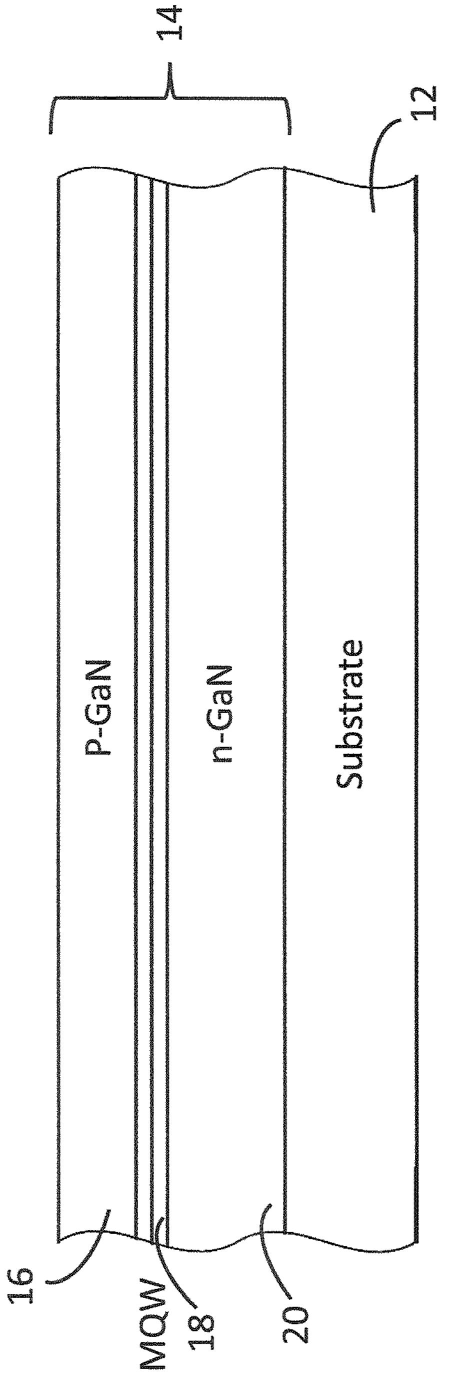
FIG. 1A (Prior Art)
FIGS. 1A-1C are enlarged schematic cross sectional drawings illustrating a prior art lift-off (LLO) process performed using a connecting substrate.
Figure 1B:
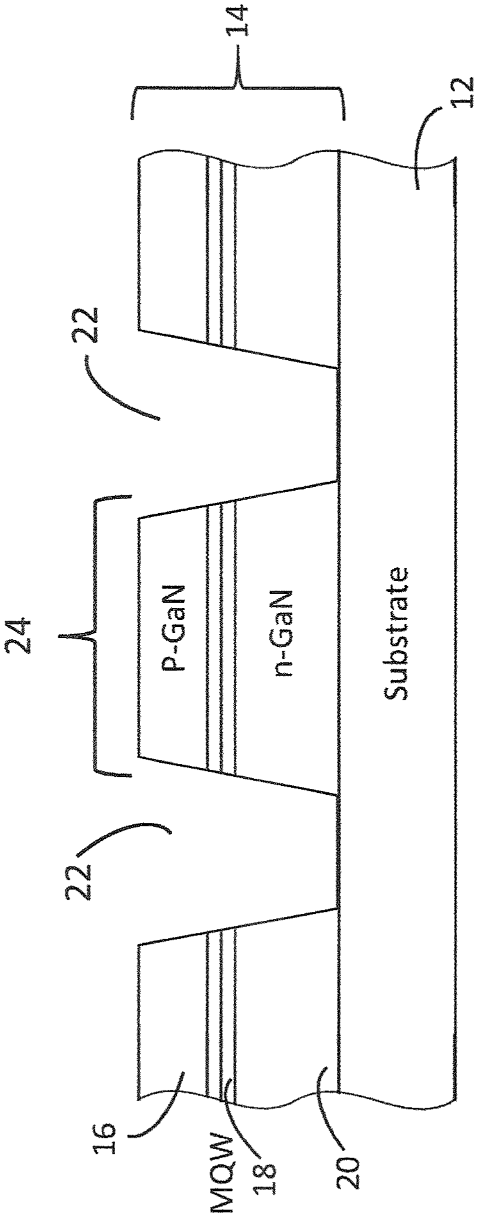
FIG. 1B (Prior Art)
Figure 1C:
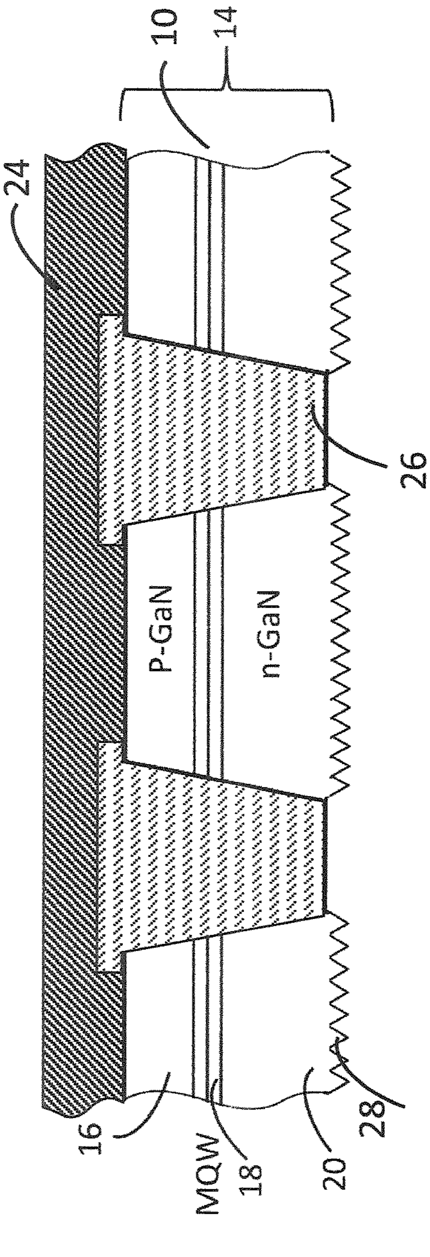
FIG. 1C (Prior Art)

As shown in FIG. 9A, a laser lift off area 54 can be selectively located by appropriate focusing of the laser beam 40 to lift selected semiconductor structures 32 onto the receiving plate 42. Using the receiving plate 42, one could selectively remove certain semiconductor structures 32 without performing laser lift-off (LLO) on the entire substrate 30 as with the prior art secondary substrate 24 (FIG. 1C). Following the laser lift-off (LLO) step, the method can also include the step of cleaning and or etching the surface of the semiconductor structure 32 on the receiving plate 42. The semiconductor structure 32 on receiving plate 42 can be etched to create rough surface improving its performance such as light extraction, output, and handling.

With the die sized semiconductor structure 32 resting on the surface of the elastomeric polymer layer 44 of the receiving plate 42, the method can also include the step of removing the semiconductor structures 32 from the receiving plate 42. This step can be performed using a conventional technique such as a pick and place mechanism for semiconductor dice.

Figure 11A:
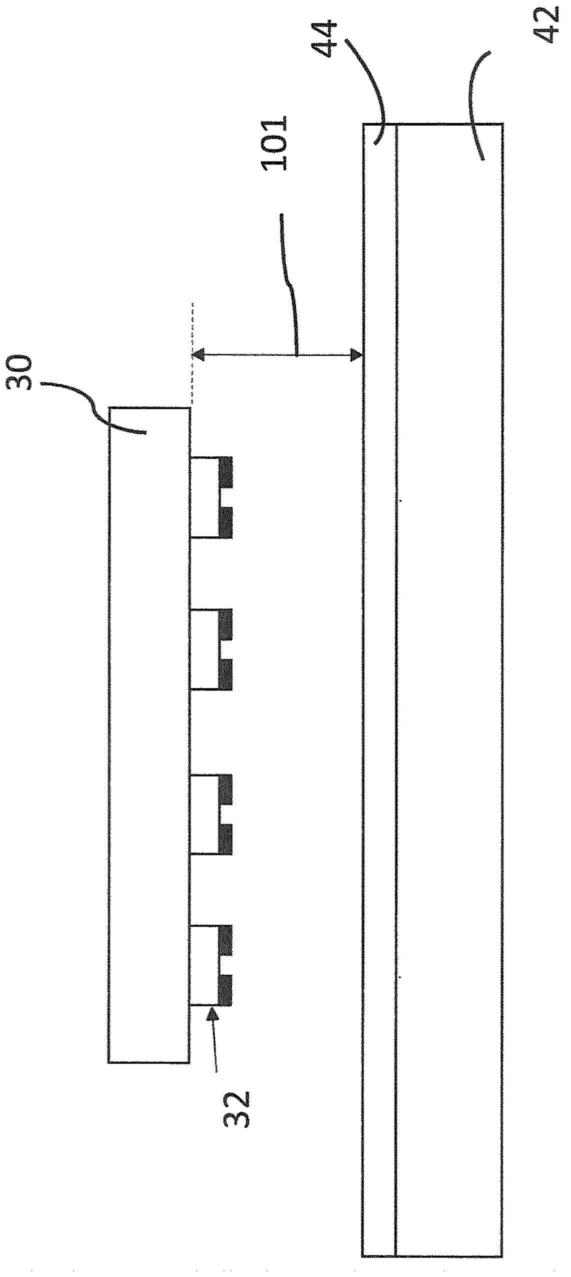
FIG. 11A is a schematic cross sectional view illustrating a laser lift off step of the alternate embodiment of the method wherein a gap is employed.

Example 4. Referring to FIG. 11A, in this example the receiving plate 42 includes a spin-on elastomeric polymer layer 44 comprised of a cured silicone pressure-sensitive adhesive composition. Also in this example, the substrate 30 comprises a four inch diameter wafer, and the receiving plate 42 comprises a six inch diameter circular plate. Further, the receiving plate 42 has a ITV (total thickness variation) of <5 μm. For forming the elastomeric polymer layer 44 the elastomer can be dispensed on the center of the receiving plate 42 using a spin coater to provide a selected thickness T (e.g., ~20 μm). For a spin-on process, the thickness T of the elastomeric polymer layer 44 will be the function of spin speed, the spin-on liquid viscosity and other factors. Normally the thickness T is radially dependent. To provide optimum thickness uniformity, one would use a larger diameter receiving plate 42. Rather than spin coating, the elastomeric polymer layer 44 can also be applied by vapor deposition, doctor blade, or screen printing or other coating techniques. As shown in FIG. 11A the gap 101 has been provided between the substrate 30 and the receiving plate 42.

Figure 11B:
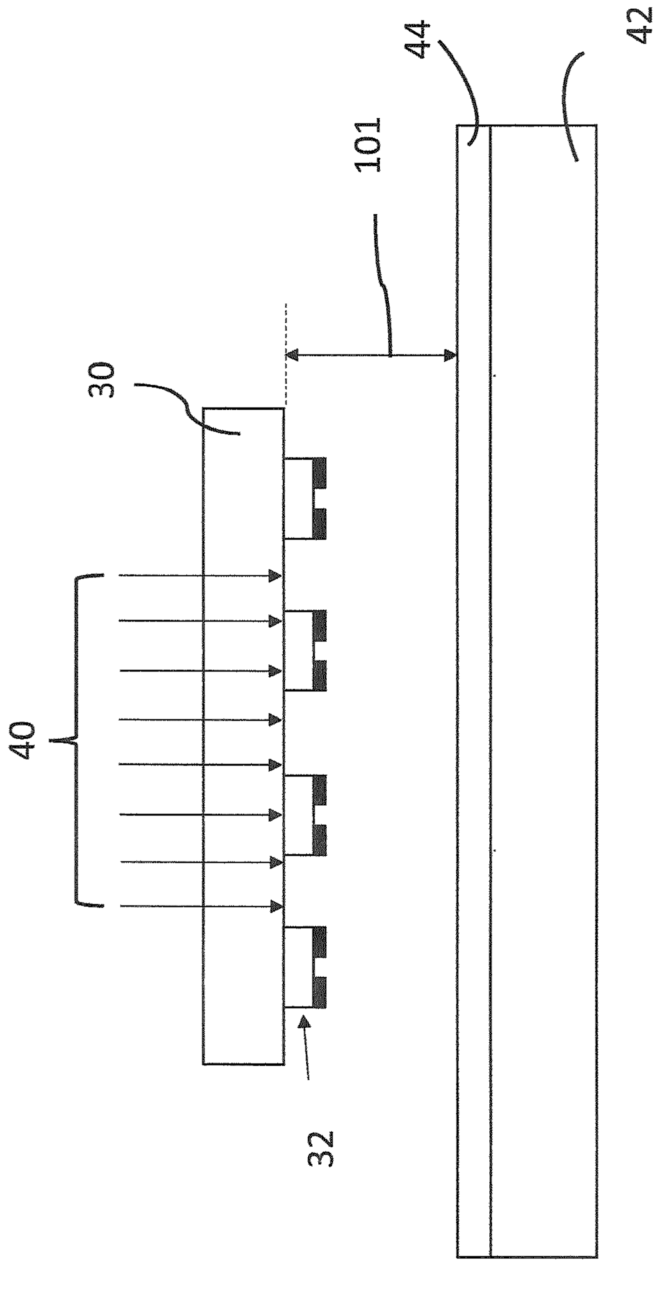
FIG. 11B is a schematic cross sectional view illustrating a laser lift off step of the alternate embodiment of the method wherein a gap is employed and using a selective laser lift off area.
Figure 11C:
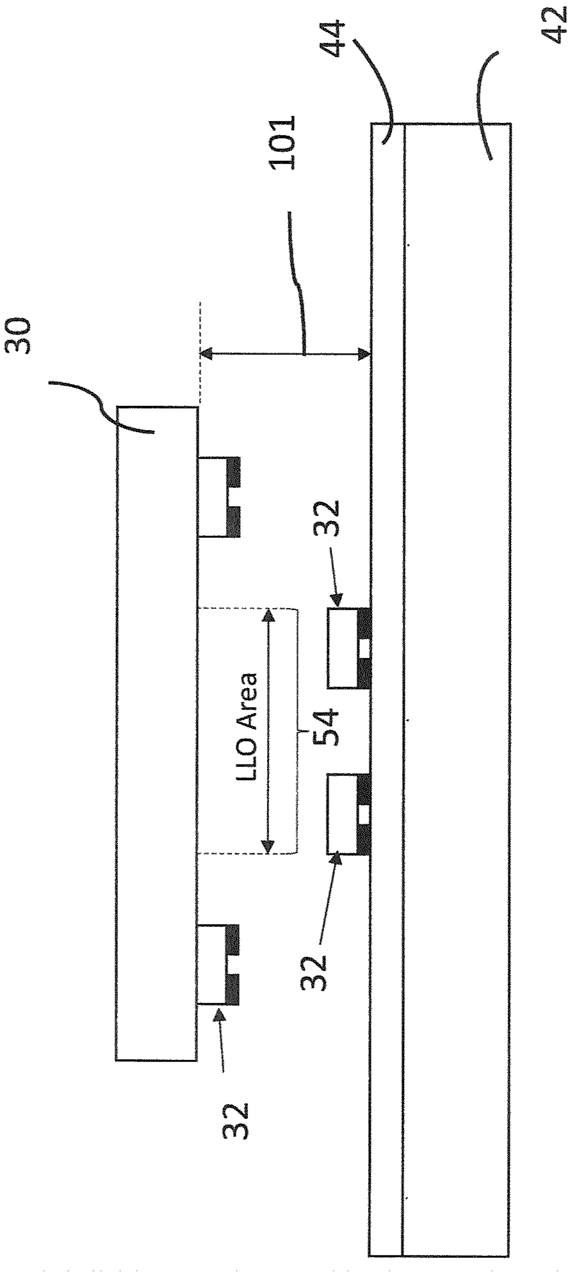
FIG. 11C is a schematic cross sectional view illustrating a laser lift off step of the alternate embodiment of the method wherein a gap is employed and using a selective laser lift off area shown with selected semiconductor structures lifted onto the receiving plate.

As shown in FIG. 11B and FIG. 11C, a laser lift off area 54 (FIG. 11C) can be selectively located by appropriate focusing of the laser beam 40 to lift off selected semiconductor structures 32. The selected semiconductor structures 32 can then fly through the gap 101 and land on the receiving plate 42. Using the receiving plate 42, one could selectively remove certain semiconductor structures 32 without performing laser lift-off (LLO) on the entire substrate 30 as with the prior art secondary substrate 24 (FIG. 1C). Following the laser lift-off (LLO) step, the method can also include the step of cleaning and/or etching the surface of the semiconductor structure 32 on the receiving plate 42. The semiconductor structure 32 on receiving plate 42 can be etched to create a rough surface improving its performance such as light extraction, output, and handling.

Figure 12A:
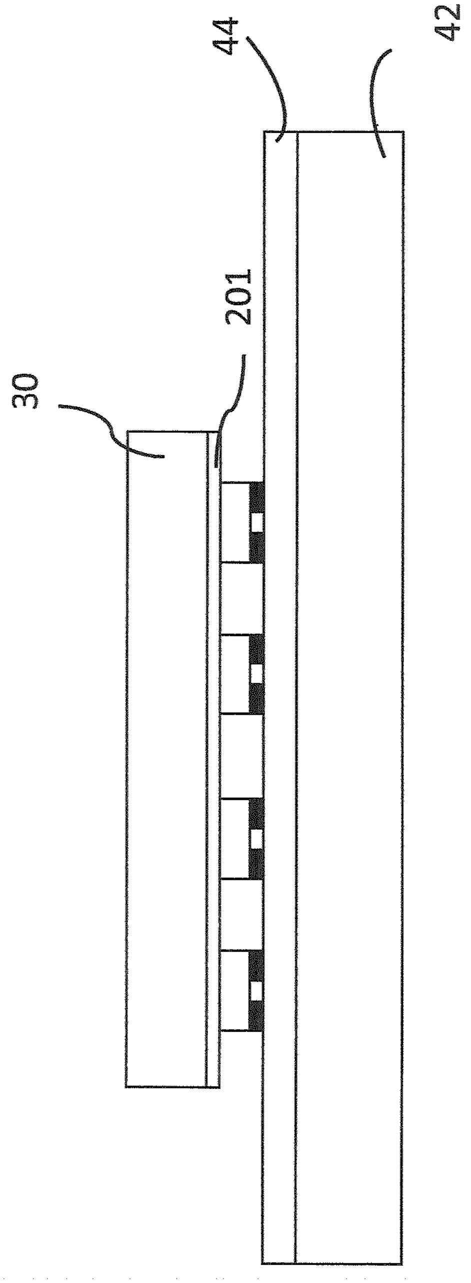
FIG. 12A is a schematic cross sectional view illustrating the substrate and the semiconductor structures having the sacrificial layer on the entire surface of the substrate applying an adhesive force to the receiving plate during an alternate embodiment of the method.
Figure 12B:
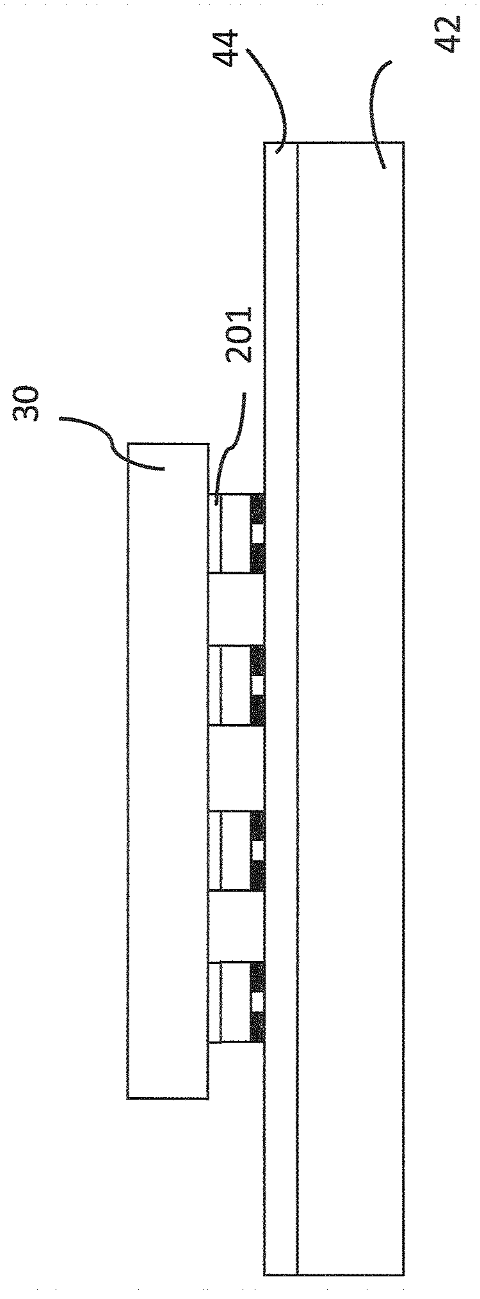
FIG. 12B is a schematic cross sectional view illustrating the substrate and the semiconductor structures having the sacrificial layer applying an adhesive force to the receiving plate during an alternate embodiment of the method.

Example 5. Referring to FIGS. 12A, 12B, 12C, 12D and 12E in this example the semiconductor structures 32 are provided on the substrate 30 with the sacrificial layer 201 substantially as previously described. The sacrificial layer 201 generates adhesive forces to physically connect the semiconductor structures 32 and the substrate 30. As shown in FIG. 12A, the sacrificial layer 201 can be provided on the entire surface of the substrate 30. FIG. 12B illustrates another embodiment wherein the sacrificial layer 201 is only present on the backside of the semiconductor structures 32. The receiving plate 42 includes a spin-on elastomeric polymer layer 44 comprised of a cured silicone pressure-sensitive adhesive composition. Also in this example, the substrate 30 comprises a four inch diameter wafer, and the receiving plate 42 comprises a six inch diameter circular plate. Further, the receiving plate 42 has a TTV (total thickness variation) of <5 μm. For forming the elastomeric polymer layer 44 the elastomer can be dispensed on the center of the receiving plate 42 using a spin coater to provide a selected thickness T (e.g., ~20 μm). For a spin-on process, the thickness T of the elastomeric polymer layer 44 will be the function of spin speed, the spin-on liquid viscosity and other factors. Normally the thickness T is radially dependent. To provide optimum thickness uniformity, one would use a larger diameter receiving plate 42. Rather than spin coating, the elastomeric polymer layer 44 can also be applied by vapor deposition, doctor blade, or screen printing.

Figure 12C:
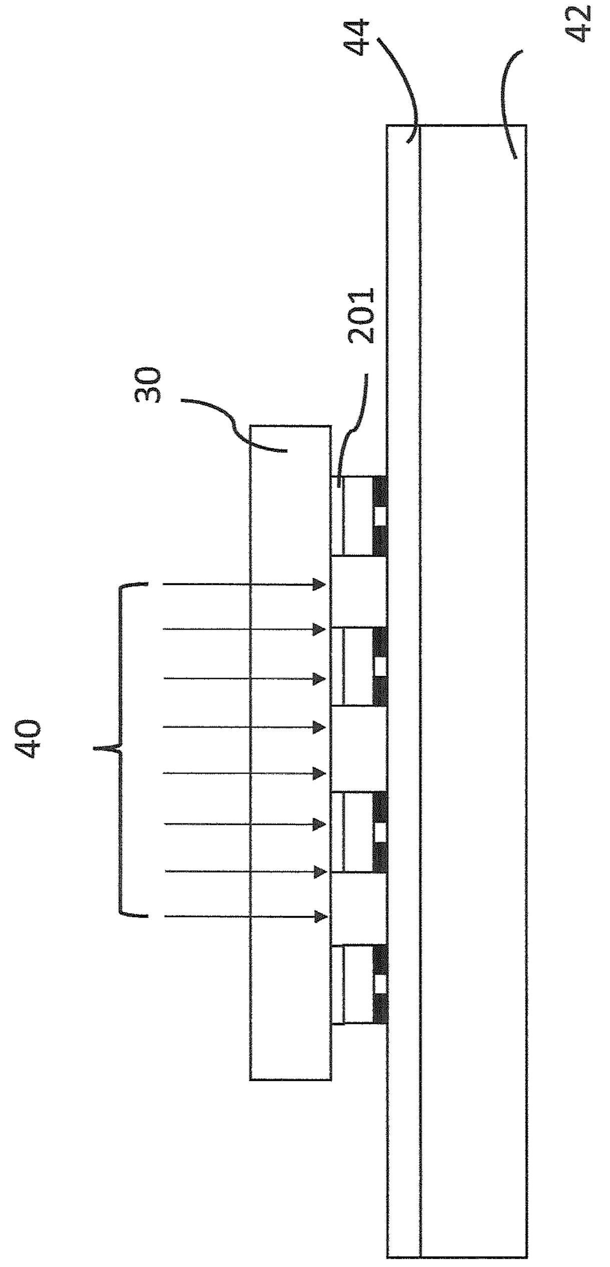
FIG. 12C is a schematic cross sectional view illustrating the substrate and the semiconductor structures having the sacrificial layer applying an adhesive force to the receiving plate and using a selective laser lift off step during an alternate embodiment of the method.
Figure 12D:
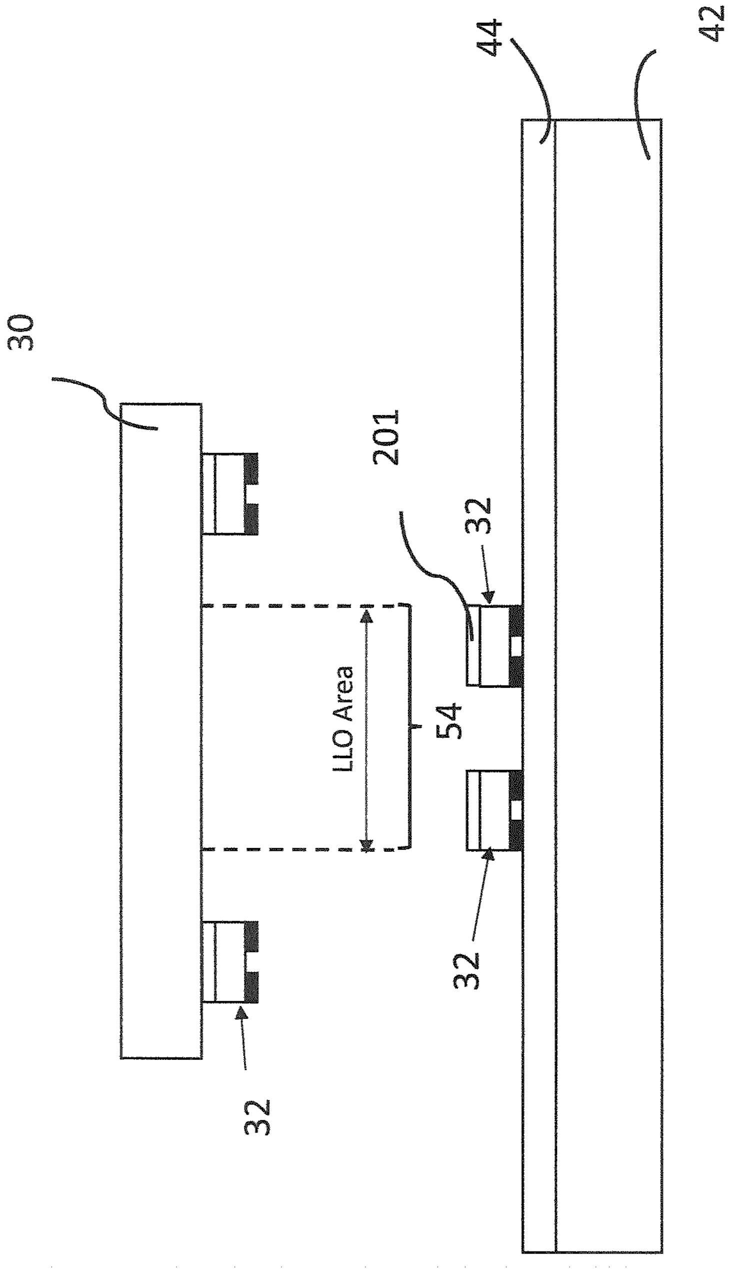
FIG. 12D is a schematic cross sectional view illustrating the substrate and the semiconductor structures having the sacrificial layer applying an adhesive force to the receiving plate and using a selective laser lift off step during an alternate embodiment of the method wherein the semiconductor structures have been lifted off onto the receiving plate.
Figure 12E:
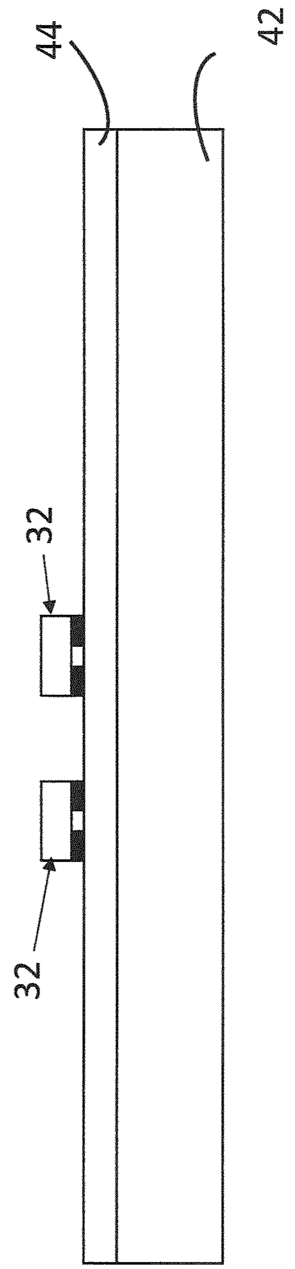
FIG. 12E is a schematic cross sectional view illustrating the substrate and the semiconductor structures during an alternate embodiment of the method wherein the semiconductor structures have been lifted off onto the receiving plate and sacrificial layers have been removed.
Figure 13:
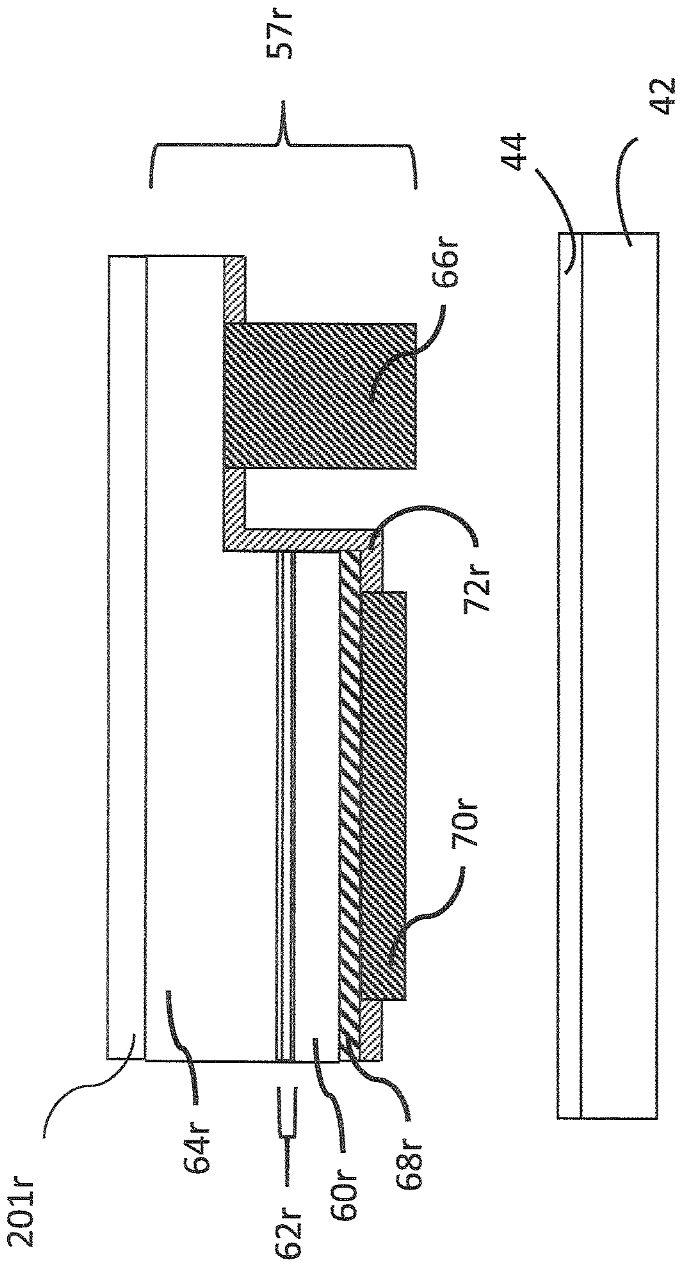
FIG. 13 is a schematic cross sectional view illustrating a completed semiconductor structure in the form of a flip chip light emitting diode (FCLED) die with a sacrificial layer.
Figure 13A:
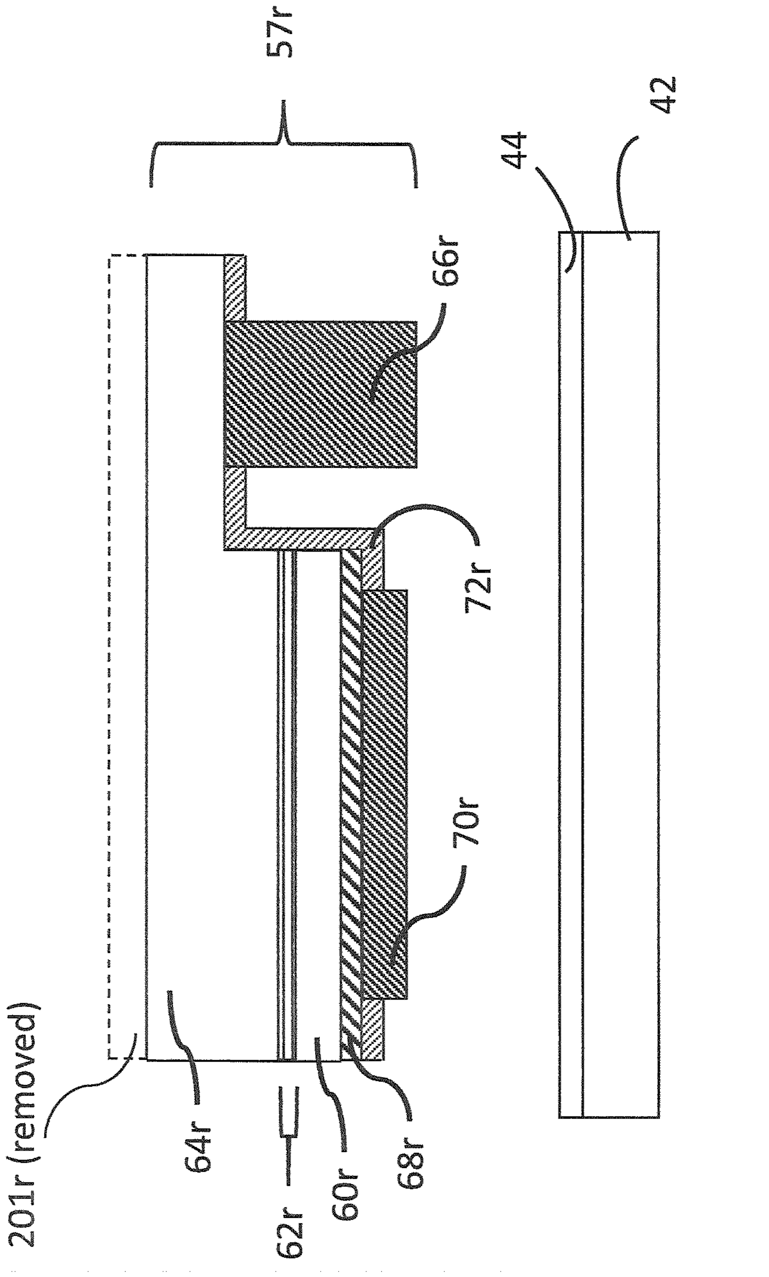
FIG. 13A is a schematic cross sectional view illustrating a completed semiconductor structure in the form of a flip chip light emitting diode (FCLED) die with a sacrificial layer having been removed.

As shown in FIGS. 12C and 12D, a laser lift off area 54 can be selectively located by appropriate focusing of the laser beam 40 to lift selected semiconductor structures 32 by ablating the interfacial layer 51 (FIG. 7A) of the sacrificial layer 201 at the interface with the substrate 30 to lift off the die sized semiconductor structures 32 onto the receiving plate 42. The semiconductor structure 32 is now separated from the substrate 30 without the need for bonding or forming a secondary substrate and without damage to the semiconductor structures 32. For the flip chip red light emitting diode (FCRLED) die 32FCRLED, FIG. 13 illustrates the portion of the sacrificial layer 201*r* remaining after the laser lift-off LLO process. As shown in FIG. 13A, a flip chip red light emitting diode (FCRLED) die 32FCRLED includes an epitaxial stack 57*r* comprised of a p-type confinement layer (P-layer) 64*r*, an n-type confinement layer (N-layer) 60*r*, an active layer (multiple quantum well (MQW) layer) 62*r* between the confinement layers configured to emit light, P-metal layers 66*r* making contact to the p-type confinement layer (P-layer) 64*r*, a mirror layer is a n-type contact layer 68*r* making a contact to the n-type confinement layer (N-layer) 60*r*), an isolation layer 72*r*, an N-electrode 70*r* making electrical contact to the mirror layer 68*r* and the sacrificial layer 201. As shown in FIG. 12D, following the laser lift-off (LLO) step, the method can also include the step of cleaning and or etching the sacrificial layer 201 to expose the top surface of the semiconductor structure 32 on the receiving plate 42. Optionally, the semiconductor structure 32 on receiving plate 42 can be etched to create a rough surface improving its performance such as light extraction, output, handling.

Referring to FIG. 13A, a completed semiconductor structure that has been separated from the receiving plate 42 comprises a flip chip red light emitting diode (FCRLED) die 32FCRLED. In this embodiment, the sacrificial layer 201*r* is removed. The flip chip red light emitting diode (LED) die 32FCRLED includes an epitaxial stack 57*r* comprised of a p-type confinement layer (P-layer) 64*r*, an n-type confinement layer (N-layer) 60*r*, an active layer (multiple quantum well (MQW) layer) 62*r* between the confinement layers configured to emit light, P-metal layers 66*r* making contact to the p-type confinement layer (P-layer) 64*r*, a mirror layer is a n-type contact layer 68*r* making a contact to the n-type confinement layer (N-layer) 60*r*), an isolation layer 72*r*, and an N-electrode 70*r* making electrical contact to the mirror layer 68*r*.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating light emitting diode (LED) dice comprising:

providing a plurality of die sized semiconductor structures on a substrate, each semiconductor structure comprising an epitaxial stack having comprising a p-type confinement layer having a surface, an n-type confinement layer, an active layer between the p-type confinement layer and the n-type confinement layer configured to emit light, a P-metal layer making contact to the p-type confinement layer configured as a P-electrode, a mirror layer on the n-type confinement layer, an isolation layer on the n-type confinement layer and an exposed portion of the p-type confinement layer, and an N-electrode making contact to the n-type confinement layer;

a sacrificial layer on the surface of the p-type confinement layer at an interface with the substrate;

providing a receiving plate having an elastomeric polymer layer;

placing the substrate and the receiving plate in proximity to one another with a gap therebetween; and performing a laser lift-off (LLO) process by directing a uniform laser beam through the substrate to the sacrificial layer at the interface of the semiconductor structures with the substrate to lift off the semiconductor structures from the substrate and through the gap onto the elastomeric polymer layer and with the sacrificial layer ablated during the laser lift-off (LLO) process.

2. The method of claim 1 further comprising following the laser lift-off (LLO) process, removing the semiconductor structures from the receiving plate.

3. The method of claim 2 wherein each semiconductor structures includes coplanar electrodes configured to provide a spacing between the semiconductor structures and the substrate.

4. A method for fabricating light emitting diode (LED) dice comprising:

providing a plurality of die sized semiconductor structures on a substrate, each semiconductor structure having coplanar electrodes, each semiconductor structure comprising an epitaxial stack comprising a p-type confinement layer having a surface, an n-type confinement layer, an active layer between the p-type confinement layer and the n-type confinement layer configured to emit light, a P-metal layer making contact to the p-type confinement layer configured as a P-electrode, a mirror layer on the n-type confinement layer, an isolation layer on the n-type confinement layer and an exposed portion of the p-type confinement layer, and an N-electrode making contact to the n-type confinement layer;

providing a receiving plate having an elastomeric polymer layer;

placing the substrate and the receiving plate in proximity to one another with a gap therebetween formed by the coplanar electrode; and performing a laser lift-off (LLO) process by directing a uniform laser beam through the substrate to the semiconductor layer at an interface of the semiconductor structures with the substrate to lift off the semiconductor structures from the substrate and through the gap onto the elastomeric polymer layer.

5. The method of claim 4 further comprising a sacrificial layer on the surface of the p-type confinement layer configured to generate an adhesive force on the substrate.

* * * * *